US012245515B2

(12) United States Patent
Yin et al.

(10) Patent No.: US 12,245,515 B2
(45) Date of Patent: Mar. 4, 2025

(54) INTERCONNECTION FOR A MEMORY ARRAY AND METHODS FOR FORMING THE SAME

(71) Applicant: Taiwan Semiconductor Manufacturing Company, Ltd., Hsin-Chu (TW)

(72) Inventors: Yu-Feng Yin, Hsinchu (TW); Min-Kun Dai, Hsinchu (TW); Chien-Hua Huang, Miaoli County (TW); Chung-Te Lin, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 617 days.

(21) Appl. No.: 17/463,985

(22) Filed: Sep. 1, 2021

(65) Prior Publication Data

US 2022/0336733 A1 Oct. 20, 2022

Related U.S. Application Data

(60) Provisional application No. 63/175,270, filed on Apr. 15, 2021.

(51) Int. Cl.
*H10N 50/01* (2023.01)
*H10B 61/00* (2023.01)
(Continued)

(52) U.S. Cl.
CPC ............ *H10N 50/01* (2023.02); *H10B 61/22* (2023.02); *H10N 50/80* (2023.02); *H10N 50/85* (2023.02)

(58) Field of Classification Search
CPC ........ H10N 50/01; H10N 50/80; H10N 50/10; H10N 50/85; H10B 61/22; H10B 61/00;
(Continued)

(56) References Cited

U.S. PATENT DOCUMENTS 8,802,504 B1 8/2014 Hou et al.
8,803,292 B2 8/2014 Chen et al.
(Continued)

OTHER PUBLICATIONS

U.S. Appl. No. 17/199,626, filed Mar. 12, 2021 by inventors Yu-Feng Yin, Tai-Yen Peng, An-Shen Chang, Han-Ting Tsai, Qiang Fu, Chung-Te Lin for "Low-Resistance Contact to Top Electrodes for Memory Cells and Methods for Forming the Same," 53 pages of text, 25 pages of drawings.
(Continued)

*Primary Examiner* — Chad M Dicke
*Assistant Examiner* — Jeremy Daniel Watts
(74) *Attorney, Agent, or Firm* — HAYNES AND BOONE, LLP

(57) ABSTRACT

Semiconductor structure and methods of forming the same are provided. An exemplary method includes providing a substrate having a first region and a second region, forming an array of memory cells over the first region of the substrate, and forming a memory-level dielectric layer around the array of memory cells. Each of the memory cells includes, from bottom to top, a bottom electrode, a memory material layer stack, and a top electrode. The exemplary method also includes forming a metal line directly interfacing a respective row of top electrodes of the array of memory cells. The metal line also directly interfaces a top surface of the memory-level dielectric layer.

20 Claims, 20 Drawing Sheets

(51) Int. Cl.
H10N 50/80 (2023.01)
H10N 50/85 (2023.01)

(58) Field of Classification Search
CPC .......... H01L 23/5226; H01L 21/76802; H01L 21/7684; H01L 21/76843; H01L 21/76877; H01L 23/522; H01L 23/528; H01L 23/53238; H01L 23/52; H01L 23/535; H01L 23/5384; H01L 23/5386; H01L 23/58; H01L 23/585; H01L 24/00; H01L 27/00; H01L 27/02; H01L 27/04; H01L 2221/00; H01L 2221/10; H01L 2223/58; H01L 2223/00; H01L 2225/00; H01L 2225/03; H01L 2229/00; H01L 21/70; H01L 21/00; H01L 21/77; H01L 23/5283; H01L 23/481; H01L 23/50; H01L 23/48; H01L 23/485; G11C 11/161
See application file for complete search history.

(56) References Cited

U.S. PATENT DOCUMENTS

| | | | |
|---|---|---|---|
| 8,803,316 B2 | 8/2014 | Lin et al. | |
| 8,993,380 B2 | 3/2015 | Hou et al. | |
| 9,203,013 B2* | 12/2015 | Li | .................. G11C 11/16 |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,496,189 B2 | 11/2016 | Yu et al. | |
| 11,716,910 B2* | 8/2023 | Huang | .................. H10N 50/01 |
| | | | 257/427 |
| 2015/0280112 A1* | 10/2015 | Li | .................. H10N 50/80 |
| | | | 438/3 |
| 2020/0127047 A1* | 4/2020 | Chen | .................. H01L 23/5226 |
| 2021/0134883 A1* | 5/2021 | Dutta | .................. H01L 23/53295 |
| 2021/0193204 A1* | 6/2021 | Jaiswal | .................. H10N 50/10 |
| 2022/0115583 A1* | 4/2022 | Wang | .................. H10B 61/00 |
| 2022/0140002 A1* | 5/2022 | Lin | .................. H10N 50/80 |
| | | | 257/427 |
| 2022/0310902 A1* | 9/2022 | Wang | .................. H10B 61/00 |

OTHER PUBLICATIONS

U.S. Appl. No. 16/887,244, filed Mar. 29, 2020 by inventors Tai-Yen Peng et al., for "Magnetic Tunnel Junction Device and Method," 42 pages of text, 45 pages of drawings.

U.S. Appl. No. 17/224,309, filed Apr. 7, 2020, by inventors Yu-Feng Yin for "Top Interconnection Metal Lines for a Memory Array Device and Methods for Forming the Same," 57 pages of text, 25 pages of drawings.

U.S. Appl. No. 17/008,000, filed Aug. 31, 2020, by inventors Yu-Feng Yin et al., "Semiconductor Device and Manufacturing Method Thereof," 26 pages of texts, 23 pages of drawings.

* cited by examiner

INTERCONNECTION FOR A MEMORY ARRAY AND METHODS FOR FORMING THE SAME

PRIORITY

This application claims the priority to U.S. Provisional Application Ser. No. 63/175,270, filed on Apr. 15, 2021, entitled "Interconnection for a Memory Array and Methods for Forming the Same," the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Electronic devices contain volatile or non-volatile electronic memory to store data. Volatile memory stores data when it is powered, while non-volatile memory is able to retain stored data when power is removed. Magneto-resistive random-access memory (MRAM) is one promising candidate for a next generation non-volatile memory technology. MRAM devices may be embedded in an interconnection structure disposed over a device substrate and are controlled by driving transistors on the device substrate. With the scaling down of MRAM devices, electrical shorts between patterned layer stacks in the interconnection structure ought to be mitigated in order to provide functional memory devices. Therefore, while existing MRAM structures and methods for forming MRAM structures are generally adequate for their intended purposes, they are not satisfactory in all aspects.

BRIEF DESCRIPTION OF THE DRAWINGS

The present disclosure is best understood from the following detailed description when read with the accompanying figure. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
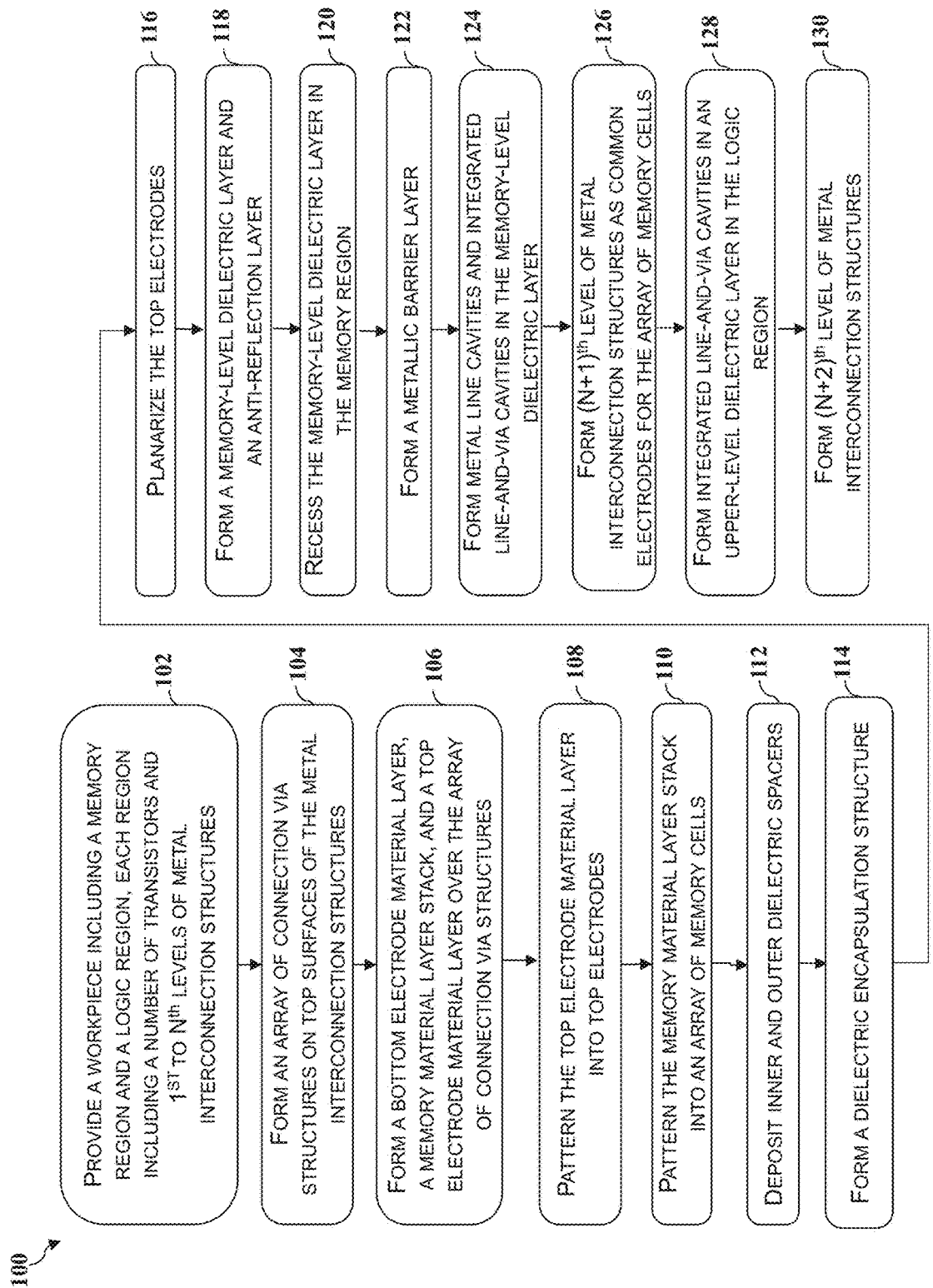
FIG. 1 illustrates a flowchart of an exemplary method for fabricating a semiconductor structure, according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

IC manufacturing process flow may be typically divided into three categories: front-end-of-line (FEOL) processes, middle-end-of-line (MEOL) processes, and back-end-of-line (BEOL) processes. FEOL processes generally encompass processes related to fabricating active IC devices, such as transistors. For example, FEOL processes may include forming isolation features, gate structures, and source/drain features. MEOL processes generally encompass processes related to fabricating contacts to features of the IC devices, such as contacts to the gate structures and/or the source/drain features. BEOL processes generally encompass processes related to fabricating an interconnection structure that interconnects IC features fabricated at the FEOL level by way of contact formed at the MEOL level. Features fabricated by FEOL processes may be referred to as FEOL features. Features fabricated by MEOL processes may be referred to as MEOL features. Features fabricated by BEOL processes may be referred to as BEOL features. In some embodiments, MRAM cells of MRAM devices are fabricated at the BEOL level and may be embedded in the interconnection structure.

MRAM devices may include multiple MRAM cells that are arranged in rows and columns in forming an array. Each MRAM cell may include a magnetic tunnel junction (MTJ) device and a driving transistor configured to control the MTJ device. The MTJ device may be embedded in an interconnection structure disposed over a device substrate. The MTJ device may include an MTJ vertically arranged between a top electrode over the MTJ and a bottom electrode below the MTJ. The MTJ includes a pinned layer separated from a free layer by a tunnel barrier layer and may digitally stores data. The magnetic orientation of the pinned layer is static (i.e., fixed), while the magnetic orientation of the free layer is capable of switching between a parallel configuration and an anti-parallel configuration with respect to that of the pinned magnetic layer. The parallel configuration provides for a low resistance state that digitally stores data as a first bit value (e.g., a logical "0"). The anti-parallel configuration provides for a high resistance state that digitally stores data as a second bit value (e.g., a logical "1"). The switching between the two configurations provides two magnetic states of the MTJ. The magnetic state of the MTJ is set by application of a write current of appropriate amplitude and polarity or read out by application of a read current to apply a voltage to a sense circuit. Depending on the resistance states of the MTJ, the voltage may be higher or lower. In some implementations, the driving transistor includes two source/drain features and a gate structure. The top electrode of the MTJ device is coupled to a bit line (BL) and the bottom electrode of the MTJ device is coupled to one of the two source/drain features of the driving transistor. A source line (SL) is electrically coupled to the other of the two source/drain features of the driving transistor. The gate structure of the driving transistor is coupled to a word line (WL). When the word line (WL) is selected by application of an enabling voltage, the driving transistor is turned on, and the MTJ device is coupled between the bit line (BL) and the source line (SL). The bit line (BL) may also be coupled to a switching transistor. The MRAM cells in the same row may be connected to a common word line (WL), and the MRAM cells in the same column may be connected to a common bit line (BL).

In some examples, the top electrode of each of the MTJ devices is individually coupled to a bit line (BL) by way of a landing via. However, as the dimensions of the IC devices decrease, it becomes more and more challenging to perfectly align the landing vias and the top electrodes. When the landing vias and the top electrodes are misaligned, electrical shorts may occur (i.e., unintended electrical connection of structures and nodes). For example, as the device dimensions shrink, the top electrode of an MTJ device becomes smaller than the landing via. As the top electrode becomes increasingly smaller than the landing via, the MTJ device becomes at risk for damage due to landing via punch through. The present disclosure provides a common electrode shared by multiple MTJ devices to enlarge the process window. That is, top electrodes of multiple MTJ devices may be jointly coupled to the common electrode. As the common electrode is larger than the single top electrode, the issue associated with satisfactorily aligning landing vias with the top electrodes may be resolved. Further, the formation of landing vias may even be skipped in some embodiments. By implementing the method of the present disclosure, process of fabricating the MRAM device is advantageously simplified, resulting in reduced fabrication cost and improved yield.

Generally, while the present disclosure is described using an exemplary structure including MTJ devices, the methods of the present disclosure may be used to form any memory cell or any array of memory cells including a vertical stack of patterned material portions that constitutes a memory cell and containing a top electrode.

The various aspects of the present disclosure will now be described in more detail with reference to the figures. FIG. 1 depicts a flowchart illustrating method 100 for forming a semiconductor structure according to embodiments of the present disclosure. Method 100 is merely an example and is not intended to limit the present disclosure to what is explicitly illustrated in method 100. Additional steps can be provided before, during and after the method 100, and some steps described can be replaced, eliminated, or moved around for additional embodiments of the methods. Not all steps are described herein in detail for reasons of simplicity. Method 100 is described below in conjunction with FIGS. 2-20, which include fragmentary cross-sectional views of a workpiece 200 at different stages of fabrication according to embodiments of method 100. Because the workpiece 200 will be formed into a semiconductor structure upon conclusion of its fabrication process, the workpiece 200 may be referred to as a semiconductor structure 200 as the context requires. Throughout the present disclosure, like reference numerals denote like features unless otherwise excepted.

Figure 2:
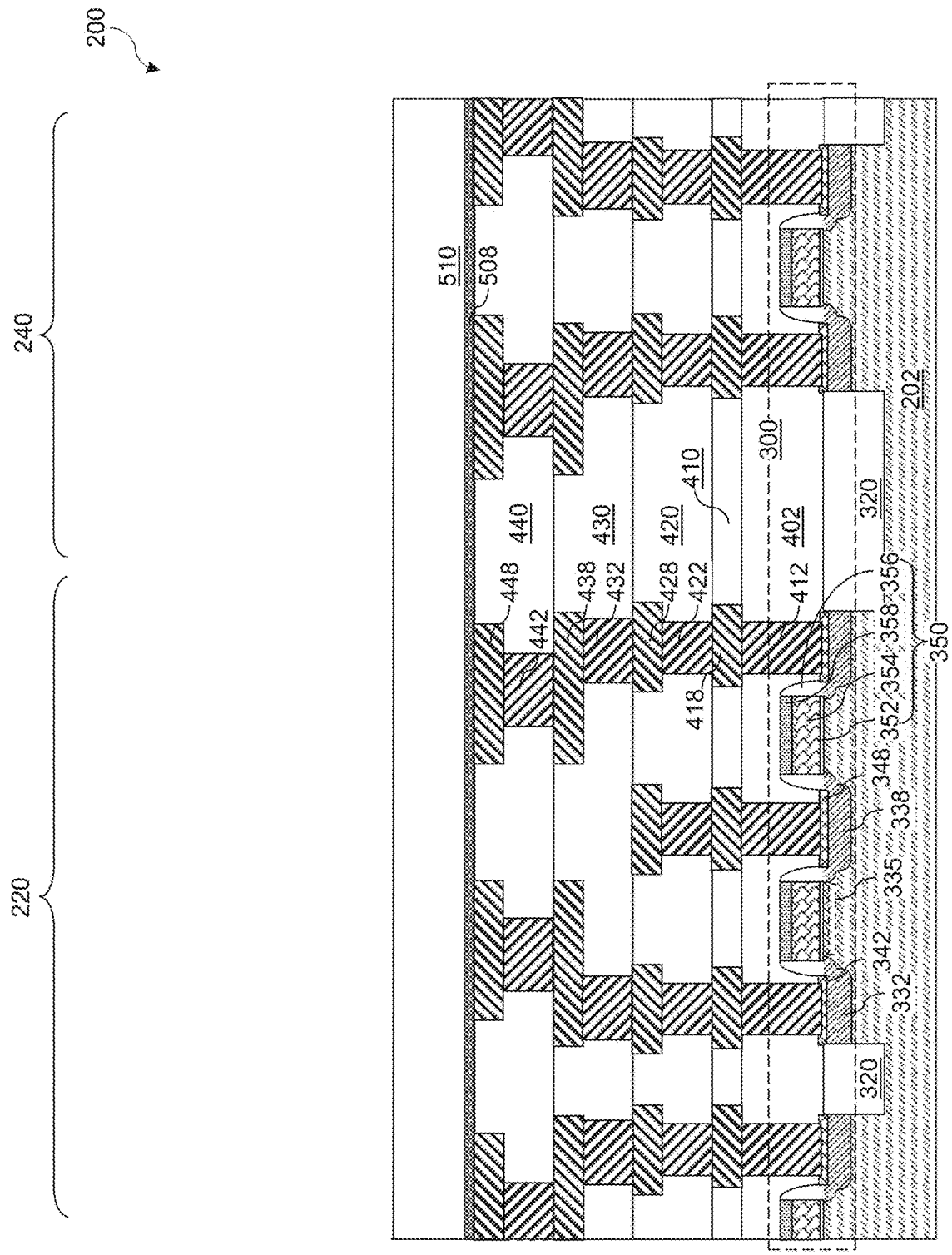
FIGS. 2, 3, 4, 5, 6, 7, 8, 9, 10, 11, 12, 13, 14, 15, 16, 17, 18, 19, and 20 illustrate fragmentary cross-sectional views of an exemplary workpiece at various fabrication stages in the method of FIG. 1, according to one or more aspects of the present disclosure.

Referring to FIGS. 1 and 2, the method 100 includes a block 102 where an exemplary workpiece 200 is received. FIG. 2 is a vertical cross-sectional view of the workpiece 200 after formation of complementary metal-oxide-semiconductor (CMOS) transistors, metal interconnection structures embedded in dielectric material layers, and a connection-via-level dielectric layer according to an embodiment of the present disclosure. The workpiece 200 includes complementary metal-oxide-semiconductor (CMOS) transistors and metal interconnection structures formed in dielectric material layers. Specifically, the workpiece 200 includes a substrate 202, which may be a semiconductor substrate such as a commercially available silicon wafer. The devices formed on the top surface of the substrate 202 may include complementary metal-oxide-semiconductor (CMOS) transistors and optionally additional semiconductor devices (such as resistors, diodes, capacitors, etc.), and are collectively referred to as CMOS circuitry 300. Shallow trench isolation structures 320 including a dielectric material such as silicon oxide may be formed in an upper portion of the substrate 202. Suitable doped semiconductor wells, such as p-type wells and n-type wells, may be formed within each area that may be laterally enclosed by a portion of the shallow trench isolation structures 320. Field effect transistors may be formed over the top surface of the substrate 202. For example, each field effect transistor may include a source region 332, a drain region 338, a semiconductor channel 335 that includes a surface portion of the substrate 202 extending between the source region 332 and the drain region 338, and a gate structure 350. Each gate structure 350 may include a gate dielectric 352, a gate electrode 354, a gate cap dielectric 358, and a dielectric gate spacer 356. A source-side metal-semiconductor alloy region 342 may be formed on each source region 332, and a drain-side metal-semiconductor alloy region 348 may be formed on each drain region 338.

The workpiece 200 may include a memory region 220 in which an array of memory elements may be subsequently formed, and a logic region 240 in which logic devices that support operation of the array of memory elements may be formed. In one embodiment, devices (such as field effect transistors) in the memory region 220 may include bottom electrode access transistors that provide access to bottom electrodes of memory cells to be subsequently formed. Top electrode access transistors that provide access to top electrodes of memory cells to be subsequently formed may be formed in the logic region 240 at this processing step. Devices (such as field effect transistors) in the logic region 240 may provide functions that may be needed to operate the array of memory cells to be subsequently formed. Specifically, devices in the logic region 240 may be configured to control the programming operation, the erase operation, and the sensing (read) operation of the array of memory cells. For example, the devices in the logic region 240 may include a sensing circuitry and/or a top electrode bias circuitry.

Various metal interconnection structures embedded in dielectric material layers may be subsequently formed over the substrate 202 and the devices (such as field effect transistors). The dielectric material layers may include, for example, a contact-level dielectric material layer 402, a first metal-line-level dielectric material layer 410, a second line-and-via-level dielectric material layer 420, a third line-and-via-level dielectric material layer 430, and a fourth line-and-via-level dielectric material layer 440. The metal interconnection structures may include device contact via structures 412 formed in the contact-level dielectric material layer 402 and contact a respective component of the CMOS circuitry 300, first metal line structures 418 formed in the first metal-line-level dielectric material layer 410, first metal via structures 422 formed in a lower portion of the second line-and-via-level dielectric material layer 420, second metal line structures 428 formed in an upper portion of the second line-and-via-level dielectric material layer 420, second metal via structures 432 formed in a lower portion of the third line-and-via-level dielectric material layer 430, third metal line structures 438 formed in an upper portion of the third line-and-via-level dielectric material layer 430, third metal via structures 442 formed in a lower portion of the fourth line-and-via-level dielectric material layer 440, and fourth metal line structures 448 formed in an upper portion of the fourth line-and-via-level dielectric material layer 440. In one embodiment, the second metal line structures 428 may include source lines that are connected a source-side power supply for an array of memory elements. The voltage provided by the source lines may be applied to the bottom electrodes through the access transistors provided in the memory region 220.

Each of the dielectric material layers 402, 410, 420, 430, and 440 may include a dielectric material such as undoped silicate glass, a doped silicate glass, organosilicate glass, amorphous fluorinated carbon, porous variants thereof, or combinations thereof. Each of the metal interconnection structures 412, 418, 422, 428, 432, 438, 442, and 448 may include at least one conductive material, which may be a combination of a metallic liner layer (such as a metallic nitride or a metallic carbide) and a metallic fill material. Each metallic liner layer may include TiN, TaN, WN, TiC, TaC, and WC, and each metallic fill material portion may include W, Cu, Al, Co, Ru, Mo, Ta, Ti, alloys thereof, and/or combinations thereof. Other suitable materials within the contemplated scope of disclosure may also be used. In one embodiment, the first metal via structures 422 and the second metal line structures 428 may be formed as integrated line and via structures by a dual damascene process, the second metal via structures 432 and the third metal line structures 438 may be formed as integrated line and via structures, and/or the third metal via structures 442 and the fourth metal line structures 448 may be formed as integrated line and via structures. While the present disclosure is described using an embodiment in which an array of memory cells formed over the fourth line-and-via-level dielectric material layer 440, embodiments are expressly contemplated herein in which the array of memory cells may be formed at a different metal interconnect level.

The dielectric material layers 402, 410, 420, 430, and 440 may be located at a lower level relative to an array of memory cells to be subsequently formed. As such, the dielectric material layers 402, 410, 420, 430, and 440 are herein referred to as lower-level dielectric layers, i.e., dielectric material layer located at a lower level relative to the array of memory cells to be subsequently formed. The metal interconnection structures 412, 418, 422, 428, 432, 438, 442, and 448 are herein referred to lower-level metal interconnection structures. A subset of the metal interconnection structures 412, 418, 422, 428, 432, 438, 442, and 448 includes lower-level metal lines (such as the fourth metal line structures 448) that are embedded in the lower-level dielectric layers and having top surfaces within a horizontal plane including a topmost surface of the lower-level dielectric layers. Generally, the total number of metal line levels within the lower-level dielectric layers 402, 410, 420, 430, and 440 may be in a range from 1 to 10.

A dielectric cap layer 508 and a connection-via-level dielectric layer 510 may be sequentially formed over the metal interconnection structures and the dielectric material layers. For example, the dielectric cap layer 508 may be formed on the top surfaces of the fourth metal line structures 448 and on the top surface of the fourth line-and-via-level dielectric material layer 440. The dielectric cap layer 508 includes a dielectric capping material that may protect underlying metal interconnection structures such as the fourth metal line structures 448. In one embodiment, the dielectric cap layer 508 may include a material that may provide high etch resistance, i.e., a dielectric material and also may function as an etch stop material during a subsequent anisotropic etch process that etches the connection-via-level dielectric layer 510. For example, the dielectric cap layer 508 may include silicon carbide or silicon nitride, and may have a thickness in a range from 5 nm to 30 nm, although lesser and greater thicknesses may also be used.

The connection-via-level dielectric layer 510 may include any material that may be used for the dielectric material layers 402, 410, 420, 430, and 440. For example, the connection-via-level dielectric layer 510 may include undoped silicate glass or a doped silicate glass deposited by decomposition of tetraethylorthosilicate (TEOS). The thickness of the connection-via-level dielectric layer 510 may be in a range from 50 nm to 200 nm, although lesser and greater thicknesses may also be used. The dielectric cap layer 508 and the connection-via-level dielectric layer 510 may be formed as planar blanket (unpatterned) layers having a respective planar top surface and a respective planar bottom surface that extends throughout the memory region 220 and the logic region 240.

Figure 3:
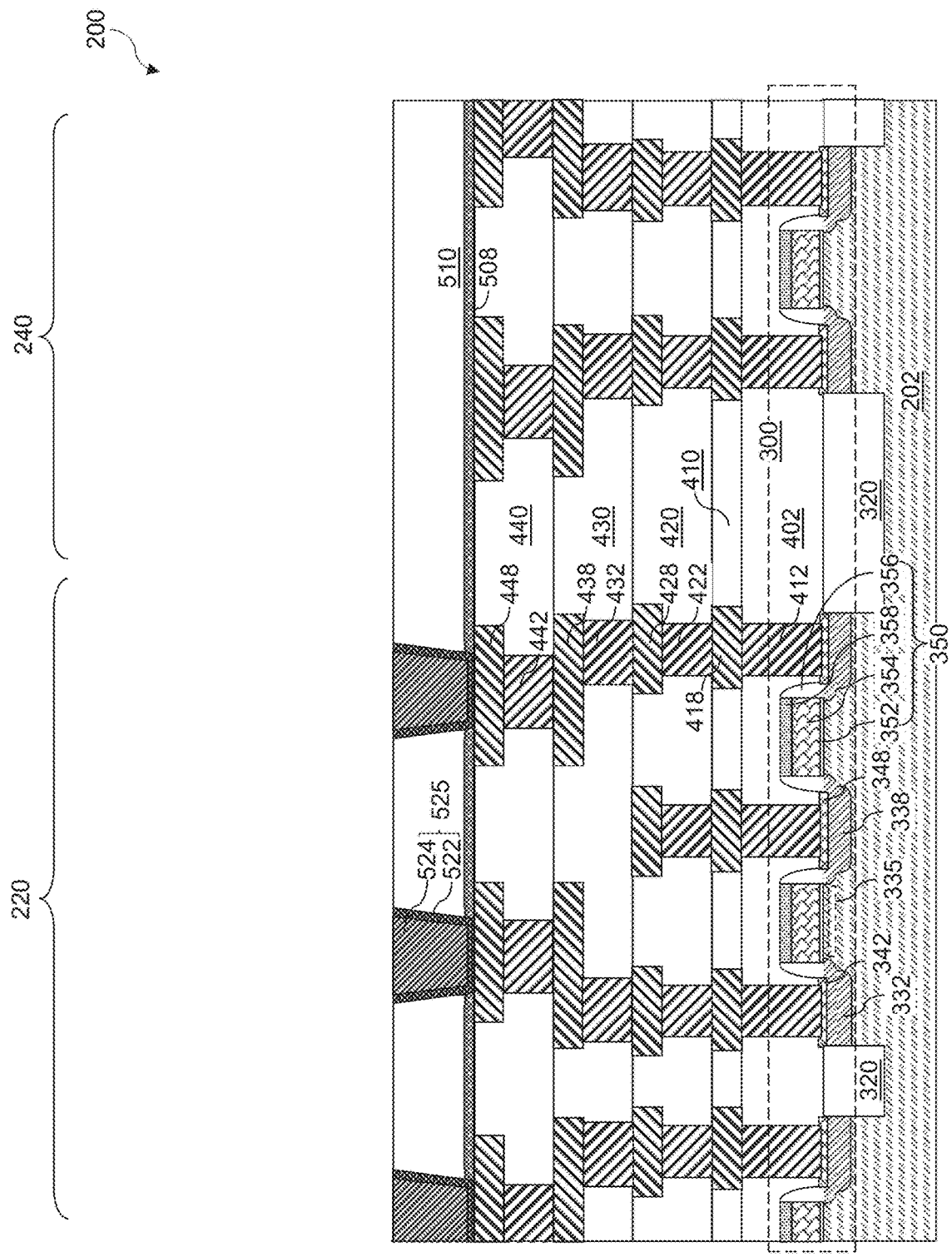

Referring to FIGS. 1 and 3, the method 100 includes a block 104 where connection via structures are formed on top surfaces of the interconnection structures. FIG. 3 is a vertical cross-sectional view of the workpiece 200 after formation of an array of connection via structures according to an embodiment of the present disclosure. Referring to FIG. 3, via cavities may be formed through the connection-via-level dielectric layer 510 and the dielectric cap layer 508. For example, a photoresist layer (not shown) may be applied over the connection-via-level dielectric layer 510 and may be patterned to form opening within areas of the memory region 220 that overlie a respective one of the fourth metal line structures 448. An anisotropic etch may be performed to transfer the pattern in the photoresist layer through the connection-via-level dielectric layer 510 and the dielectric cap layer 508. The via cavities formed by the anisotropic etch process are herein referred to as lower-electrode-contact via cavities because bottom electrode connection via structures are subsequently formed in the lower-electrode-contact via cavities. The lower-electrode-contact via cavities may have tapered sidewalls having a taper angle (with respective to a vertical direction) in a range from 1 degree to 10 degrees. A top surface of the fourth metal line structure 448 may be physically exposed at the bottom of each lower-electrode-contact via cavity. The photoresist layer may be subsequently removed, for example, by ashing.

A metallic barrier layer may be formed as a material layer. The metallic barrier layer may cover physically exposed top surfaces of the fourth metal line structures 448, tapered sidewalls of the lower-electrode-contact via cavities, and the top surface of the connection-via-level dielectric layer 510 without any hole therethrough. The metallic barrier layer may include a conductive metallic nitride such as TiN, TaN, and/or WN. Other suitable materials within the contemplated scope of disclosure may also be used. The thickness of the metallic barrier layer may be in a range from 3 nm to 20 nm, although lesser and greater thicknesses may also be used.

A metallic fill material such as tungsten or copper may be deposited in remaining volumes of the lower-electrode-contact via cavities. Portions of the metallic fill material and the metallic barrier layer that overlie the horizontal plane including the topmost surface of the connection-via-level dielectric layer 510 may be removed by a planarization process such as chemical mechanical planarization to form. Each remaining portion of the metallic fill material located in a respective via cavity comprises a metallic via fill material portion 524. Each remaining portion of the metallic barrier layer in a respective via cavity comprises a metallic barrier layer 522. Each combination of a metallic barrier layer 522 and a metallic via fill material portion 524 that fills a via cavity constitutes a connection via structure 525. An array of connection via structures 525 may be formed in the connection-via-level dielectric layer 510 on underlying metal interconnect structures. The array of connection via structures 525 may contact top surfaces of a subset of the fourth metal line structures 448. Generally, the array of connection via structures 525 contacts top surfaces of a subset of lower-level metal lines located at the topmost level of the lower-level dielectric layers 402, 410, 420, 430, and 440.

Figure 4:
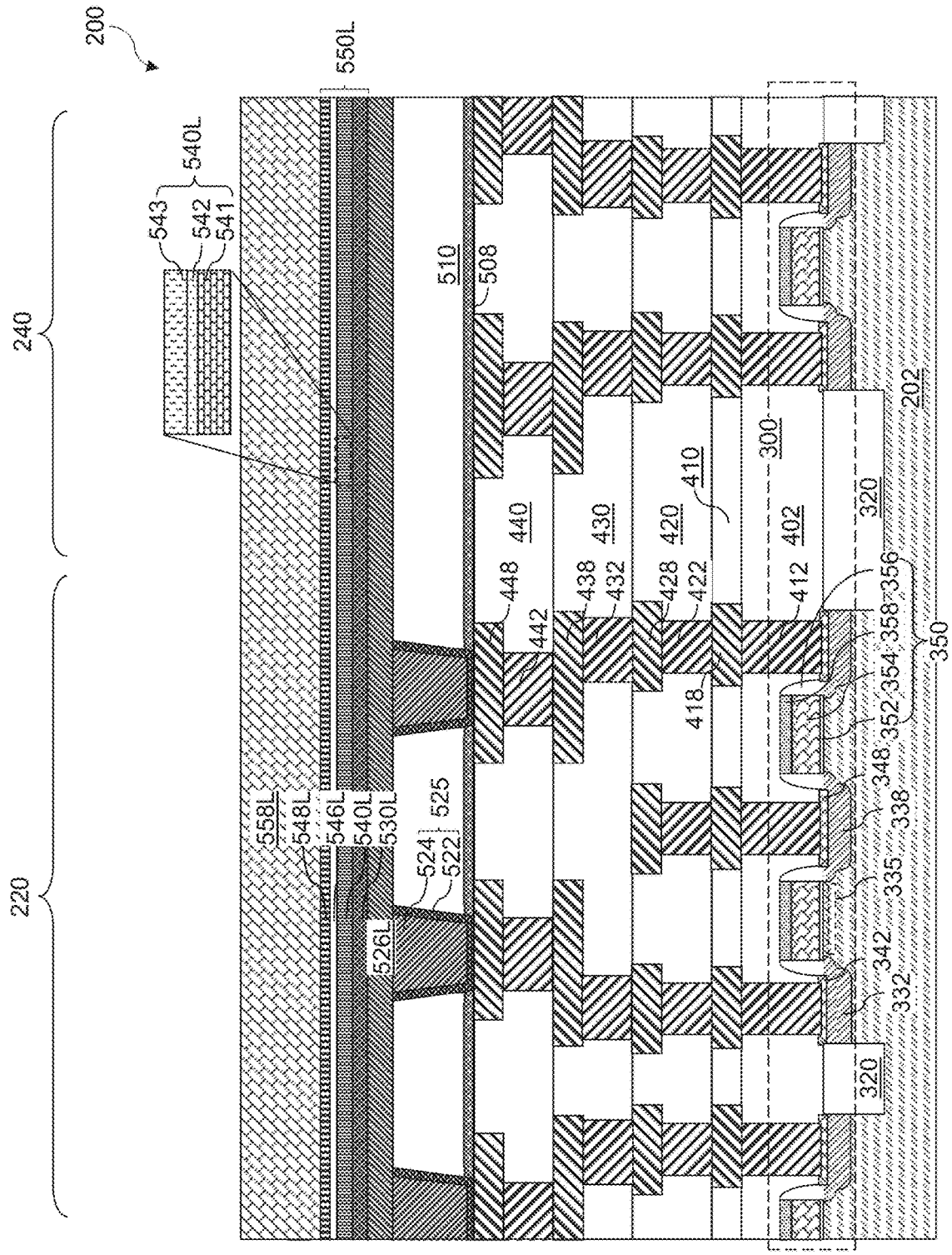

Referring to FIGS. 1 and 4, the method 100 includes a block 106 where multiple material layers of memory cells are deposited. FIG. 4 is a vertical cross-sectional view of the workpieces 200 after formation of a bottom electrode material layer, a memory material layer stack, and a top electrode material layer according to an embodiment of the present disclosure. Particularly, a bottom electrode material layer 526L, a memory material layer stack 550L, and a top electrode material layer 558L may be formed over the connection-via-level dielectric layer 510 and the array of connection via structures 525.

The bottom electrode material layer 526L includes at least one nonmagnetic metallic material such as TiN, TaN, WN, W, Cu, Al, Ti, Ta, Ru, Co, Mo, Pt, an alloy thereof, and/or a combination thereof. Other suitable materials within the contemplated scope of disclosure may also be used. For example, the bottom electrode material layer 526L may include, and/or may consist essentially of, an elemental metal such as W, Cu, Ti, Ta, Ru, Co, Mo, or Pt. The thickness of the bottom electrode material layer 526L may be in a range from 10 nm to 100 nm, although lesser and greater thicknesses may also be used.

In one embodiment, the memory material layer stack 550L may include, from bottom to top, an optional nonmagnetic metallic buffer material layer 530L, a synthetic antiferromagnet layer 540L, a nonmagnetic tunnel barrier material layer 546L, and a free magnetization material layer 548L. The layers within the memory material layer stack 550L may be deposited by a respective chemical vapor deposition process or a respective physical vapor deposition process. Each layer within the memory material layer stack 550L may be deposited as planar blanket material layers having a respective uniform thickness throughout. Generally, the memory material layer stack 550L is formed between the bottom electrode material layer 526L and the top electrode material layer 558L.

The nonmagnetic metallic buffer material layer 530L includes a nonmagnetic material that may function as a seed layer. Specifically, the nonmagnetic metallic buffer material layer 530L may provide a template crystalline structure that aligns polycrystalline grains of the materials of the synthetic antiferromagnet layer 540L along directions that maximizes the magnetization of a reference layer within the synthetic antiferromagnet layer 540L. The nonmagnetic metallic buffer material layer 530L may include Ti, a CoFeB alloy, a NiFe alloy, ruthenium, or a combination thereof. Other suitable materials are within the contemplated scope of disclosure. The thickness of the nonmagnetic metallic buffer material layer 530L may be in a range from 3 nm to 30 nm, although lesser and greater thicknesses may also be used.

The synthetic antiferromagnet (SAF) layer 540L may include a layer stack of a ferromagnetic hard layer 541, an antiferromagnetic coupling layer 542, and a reference magnetization layer 543. Each of the ferromagnetic hard layer 541 and the reference magnetization layer 543 may have a respective fixed magnetization direction. The antiferromagnetic coupling layer 542 provides antiferromagnetic coupling between the magnetization of the ferromagnetic hard layer 541 and the magnetization of the reference magnetization layer 543 so that the magnetization direction of the ferromagnetic hard layer 541 and the magnetization direction of the reference magnetization layer 543 remain fixed during operation of the memory cells to be subsequently formed. The ferromagnetic hard layer 541 may include a hard ferromagnetic material such as PtMn, IrMn, RhMn, FeMn, OsMn, etc. The reference magnetization layer 543 may include a hard ferromagnetic material such as Co, CoFe, CoFeB, CoFeTa, NiFe, CoPt, CoFeNi, etc. Other suitable materials within the contemplated scope of disclosure may also be used. The antiferromagnetic coupling layer 542 may include ruthenium or iridium. The thickness of the antiferromagnetic coupling layer 542 may be selected such that the exchange interaction induced by the antiferromagnetic coupling layer 542 stabilizes the relative magnetization directions of the ferromagnetic hard layer 541 and the reference magnetization layer 543 at opposite directions, i.e., in an antiparallel alignment. In one embodiment, the net magnetization of the SAF layer 540L is by matching the magnitude of the magnetization of the ferromagnetic hard layer 541 with the magnitude of the magnetization of the reference magnetization layer 543. The thickness of the SAF layer 540L may be in a range from 5 nm to 30 nm, although lesser and greater thicknesses may also be used.

The nonmagnetic tunnel barrier material layer 546L may include a tunneling barrier material, which may be an electrically insulating material having a thickness that allows electron tunneling. For example, the nonmagnetic tunnel barrier material layer 546L may include magnesium oxide (MgO), aluminum oxide ($Al_2O_3$), aluminum nitride (AlN), aluminum oxynitride (AlON), hafnium oxide ($HfO_2$) or zirconium oxide ($ZrO_2$). Other suitable materials within the contemplated scope of disclosure may also be used. The thickness of the nonmagnetic tunnel barrier material layer 546L may be 0.7 nm to 1.3 nm, although lesser and greater thicknesses may also be used.

The free magnetization material layer 548L includes a ferromagnetic material having two stable magnetization directions that are parallel or antiparallel to the magnetization direction of the reference magnetization layer 543. The free magnetization material layer 548L includes a hard ferromagnetic material such as Co, CoFe, CoFeB, CoFeTa, NiFe, CoPt, CoFeNi, etc. Other suitable materials within the contemplated scope of disclosure may also be used. The thickness of the free magnetization material layer 548L may be in a range from 1 nm to 6 nm, although lesser and greater thicknesses may also be used.

The top electrode material layer 558L includes a top electrode material, which may include any nonmagnetic material that may be used for the bottom electrode material layer 526L. Exemplary metallic materials that may be used for the top electrode material layer 558L include, but are not limited to, TiN, TaN, WN, W, Cu, Al, Ti, Ta, Ru, Co, Mo, Pt, an alloy thereof, and/or a combination thereof. Other suitable materials within the contemplated scope of disclosure may also be used. For example, the top electrode material layer 558L may include, and/or may consist essentially of, an elemental metal such as W, Cu, Ti, Ta, Ru, Co, Mo, or Pt. The thickness of the top electrode material layer 558L may be in a range from 8 nm to 80 nm, such as from 16 nm to 40 nm, although lesser and greater thicknesses may also be used. In one embodiment, the top electrode material layer 558L may have a homogenous material composition throughout.

While the present disclosure is described using an embodiment in which the memory material layer stack 550L includes the nonmagnetic metallic buffer material layer 530L, the synthetic antiferromagnet layer 540L, the nonmagnetic tunnel barrier material layer 546L, and the free magnetization material layer 548L, the methods and structures of the present disclosure may be applied to any structure in which the memory material layers include a different layer stack provided between the bottom electrode material layer 526L and the top electrode material layer 558L and include material layers that may store information in any manner. Modifications of the present disclosure are expressly contemplated herein in which the memory material layers include a phase change memory material, a ferroelectric memory material, or a vacancy-modulated conductive oxide material.

Figure 5:
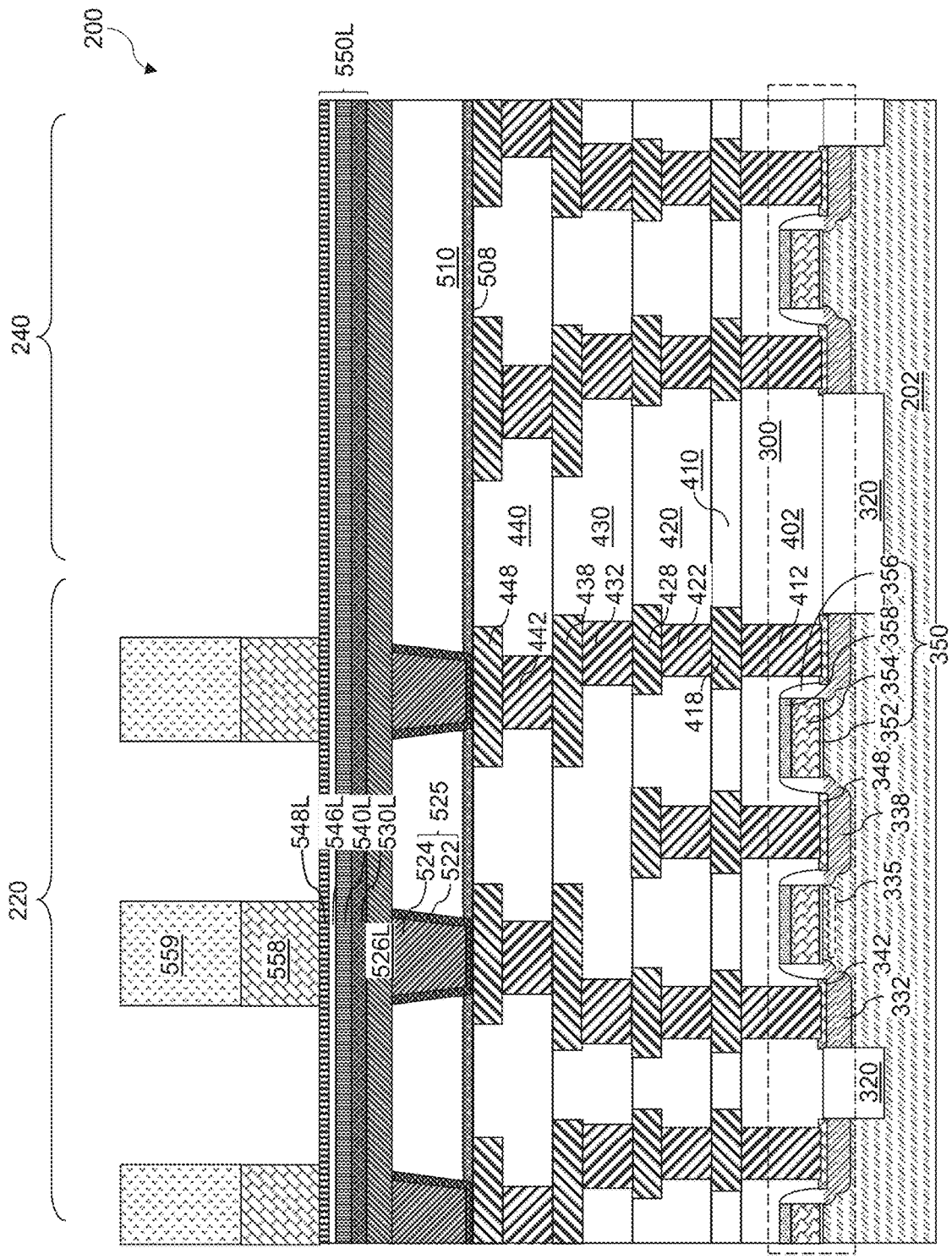

Referring to FIGS. 1 and 5, the method 100 includes a block 108 where the top electrode material layer is patterned into top electrodes. FIG. 5 is a vertical cross-sectional view of the workpiece 200 after patterning the top electrode material layer 558L into top electrodes 558 according to an embodiment of the present disclosure. Referring to FIG. 5, a photoresist layer 559 may be applied over the top electrode material layer 558L, and may be lithographically patterned into an array discrete photoresist material portions in the memory region 220. Each patterned portion of the photoresist layer 559 may overlie a respective one of the connection via structures 525. The sidewall(s) of each patterned portion of the photoresist layer 559 may coincide with, may be laterally offset outward from, or may be laterally offset inward from, the periphery of a top surface of an underlying connection via structure 525. The sidewall(s) of each patterned portion of the photoresist layer 559 may have a horizontal cross-sectional shape of a circle, an ellipse, a rectangle, a rounded rectangle, or of any generally curvilinear closed two-dimensional shape.

A first anisotropic etch process may be performed to etch unmasked portions of the top electrode material layer 558L. In one embodiment, the topmost layer of the memory material layer stack 550L may be used as an etch stop layer. Each patterned portion of the top electrode material layer 558L comprises a top electrode 558. A two-dimensional array of top electrodes 558 may be formed by the anisotropic etch process. In one embodiment, the two-dimensional array of top electrodes 558 may be formed as a two-dimensional periodic array. In one embodiment, the two-dimensional periodic array of top electrodes 558 may be formed as a rectangular periodic array having a first pitch along a first horizontal direction and having a second pitch along a second horizontal direction that is perpendicular to the first horizontal direction. The photoresist layer 559 may be removed after the first anisotropic etch process, or may remain on the two-dimensional array of top electrodes 558 during a subsequent second anisotropic etch process.

Figure 6:
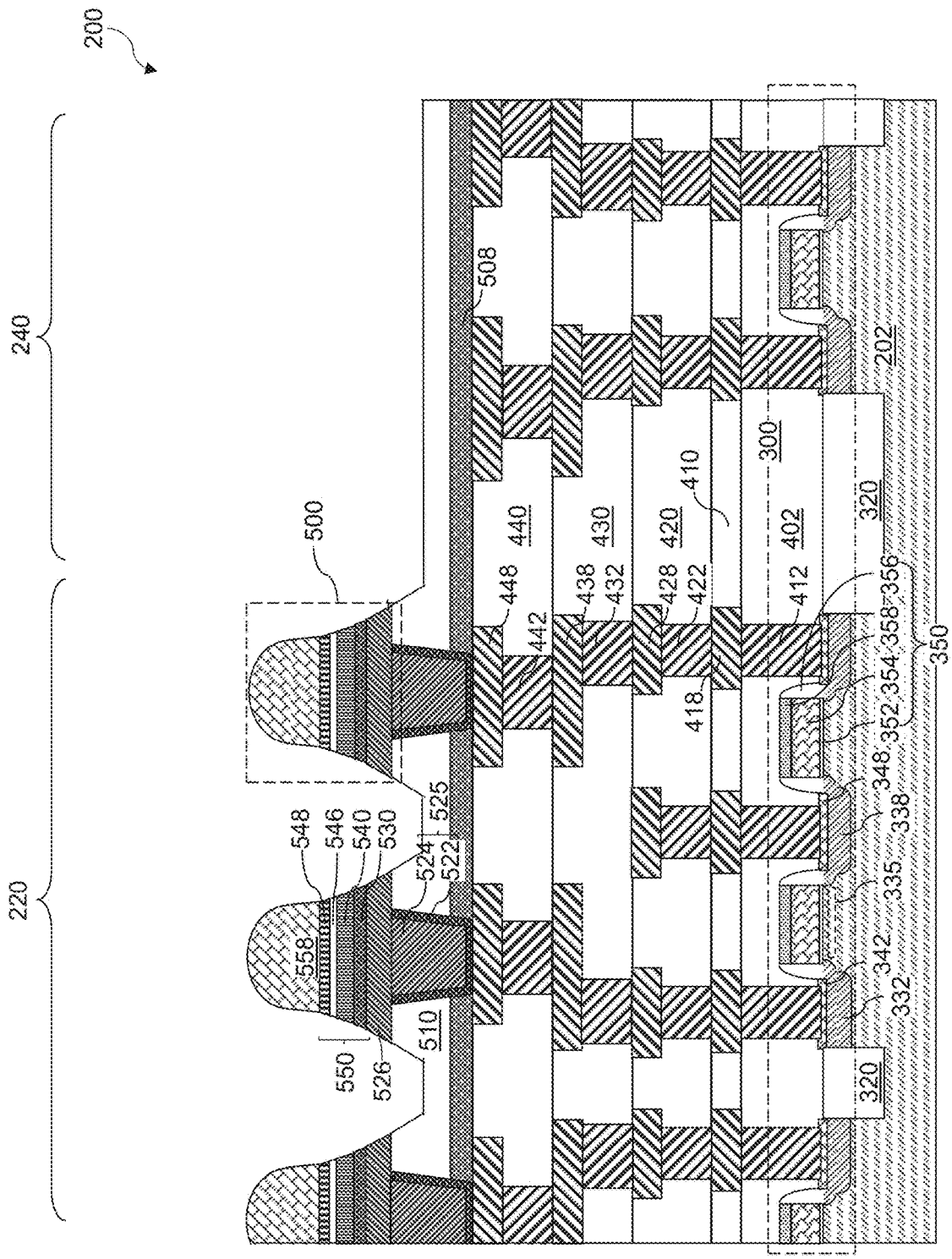

Referring to FIGS. 1 and 6, the method 100 includes a block 110 where an array of memory cells is formed by patterning the memory material layer stack 550L. FIG. 6 is a vertical cross-sectional view of the workpiece 200 after formation of an array of memory cells according to an embodiment of the present disclosure. Referring to FIG. 6, a second anisotropic etch process may be performed to transfer the pattern of the two-dimensional array of top electrodes 558 (or the pattern of the two-dimensional array of patterned photoresist material portions) through the memory material layer stack 550L and the bottom electrode material layer 526L. Portions of the memory material layer stack 550L and the bottom electrode material layer 526L that are not masked by the two-dimensional array of top electrodes 558 are etched during the second anisotropic etch process. In embodiments in which the photoresist layer 559 is present at the beginning of the second anisotropic etch process, the photoresist layer 559 may be collaterally consumed during the second anisotropic etch process, and the two-dimensional array of top electrodes 558 may be used as an etch mask at least during patterning of the bottom electrode material layer 526L. Alternatively, in embodiments in which the photoresist layer 559 is removed prior to the second anisotropic etch process, the two-dimensional array of top electrodes 558 may be used as an etch mask throughout the second anisotropic etch process.

The second anisotropic etch process may include a series of anisotropic etch steps that sequentially etches the various material layers of the underlying layer stack. In one embodiment, patterned portions of the layer stack may include sidewalls having a non-zero taper angle, i.e., having a non-vertical surface. The taper angle may vary from layer to layer, and generally may be in a range from 3 degrees to 30 degrees, such as from 6 degrees to 20 degrees, although lesser and greater taper angles may also be used. Unmasked portions of the connection-via-level dielectric layer 510 may be vertically recessed by the second anisotropic etch process. In an alternative embodiment, an ion milling process may be used in lieu of the second anisotropic etch process.

Generally, the top electrode material layer 558L, the memory material layer stack 550L, and the bottom electrode material layer 526L may be patterned in a two-dimensional periodic array of memory cells 500. In one embodiment, each memory cell 500 may be a magnetic tunnel junction (MTJ) memory cell. Each patterned portion of the memory material layer stack 550L is referred to as a magnetic tunnel junction 550. Each patterned portion of the bottom electrode material layer 526L is referred to as a bottom electrode 526. After the patterning, each memory cell 500 may include a vertical stack including a top electrode 558, a magnetic tunnel junction 550, and a bottom electrode 526.

Each magnetic tunnel junction 550 may include a synthetic antiferromagnet (SAF) structure 540, a nonmagnetic tunnel barrier layer 546, and a free magnetization layer 548. A magnetic tunnel junction 550 may include an optional nonmagnetic metallic buffer layer 530. Each bottom electrode 526 is a patterned portion of the bottom electrode material layer 526L. Each nonmagnetic metallic buffer layer 530 is a patterned portion of the nonmagnetic metallic buffer material layer 530L. Each SAF structure 540 is a patterned portion of the SAF layer 540L. Each nonmagnetic tunnel barrier layer 546 is a patterned portion of the nonmagnetic tunnel barrier material layer 546L. Each free magnetization layer 548 is a patterned portion of the free magnetization material layer 548L. The synthetic antiferromagnetic structure 540 may include a layer stack of a ferromagnetic hard layer 541, an antiferromagnetic coupling layer 542, and a reference magnetization layer 543 (FIG. 4). Generally, in embodiments in which each memory cell 500 comprises a magnetic tunnel junction 550, each memory tunnel junction 550 may comprise a reference magnetization layer 543, a nonmagnetic tunnel barrier layer 546 in contact with the reference magnetization layer 543, and a free magnetization layer 548 in contact with the nonmagnetic tunnel barrier layer 546.

The array of connection via structures 525 may be located underneath the array of memory cells 500, and may contact a bottom surface of a respective one of the bottom electrodes 526. Portions of the connection-via-level dielectric layer 510 that are not covered by the two-dimensional array of memory cells 500 may be vertically recessed below the horizontal plane including the interfaces between the array of connection via structures 525 and the array of memory cells 500. The remaining portions of the connection-via-level dielectric layer 510 may include a recessed horizontal top surface that is adjoined to bottom peripheries of tapered sidewalls of portions of the connection-via-level dielectric layer 510 that underlie the array of memory cells 500.

Figure 7:
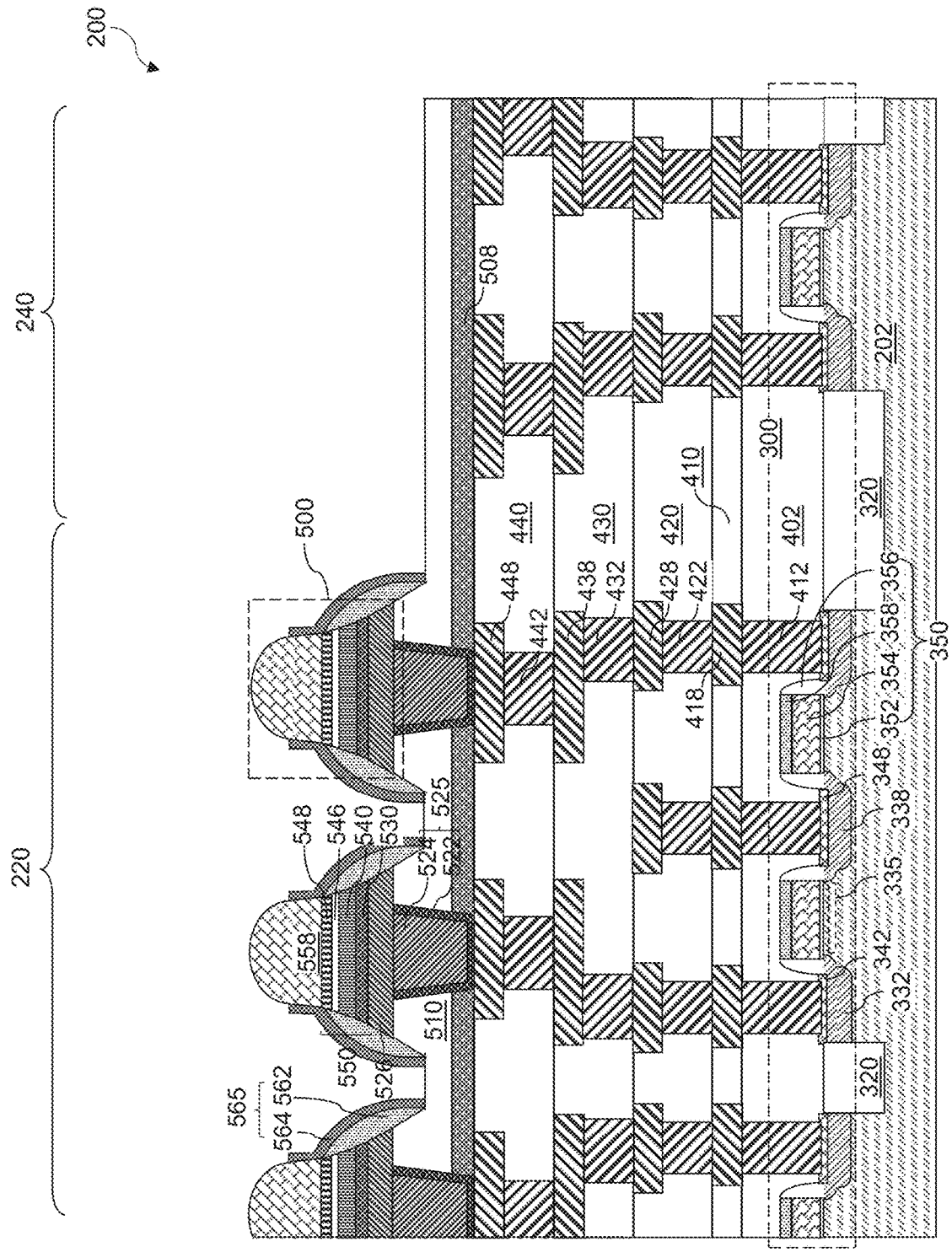

Referring to FIGS. 1 and 7, the method 100 includes a block 112 where inner dielectric spacer and outer dielectric spacer are deposited over the array of memory cells. FIG. 7 is a vertical cross-sectional view of the workpiece 200 after formation of an array of inner dielectric spacer portions and an array of outer spacer portions according to an embodiment of the present disclosure. Referring to FIG. 7, a first dielectric material such as silicon nitride may be conformally deposited over the array of memory cells 500. For example, the first dielectric material may be deposited by a chemical vapor deposition process. The thickness of the first dielectric material over a horizontal surface may be in a range from 2 nm to 20 nm, such as from 4 nm to 10 nm, although lesser and greater thicknesses may also be used. An anisotropic etch process may be performed to remove horizontal portions of the first dielectric material. Remaining portions of the first dielectric material comprise an array of inner dielectric spacer portions 562 that laterally surrounds the array of memory cells 500. In one embodiment, the duration of the anisotropic etch process may be selected such that sidewalls of the top electrodes 558 are partly or fully physically exposed. The maximum thickness of each inner dielectric spacer portion 562 may be in a range from 2 nm to 20 nm, such as from 4 nm to 10 nm, although lesser and greater thicknesses may also be used. Subsequently, a second dielectric material such as a dielectric metal oxide may be conformally deposited over the array of inner dielectric spacer portions 562. For example, the second dielectric material may include aluminum oxide, hafnium oxide, lanthanum oxide, or yttrium oxide, and may be deposited by a chemical vapor deposition process. The thickness of the second dielectric material over a horizontal surface may be in a range from 2 nm to 20 nm, such as from 4 nm to 10 nm, although lesser and greater thicknesses may also be used. An anisotropic etch process may be performed to remove horizontal portions of the second dielectric material. Remaining portions of the second dielectric material comprise an array of outer dielectric spacer portions 564 that laterally surrounds the array of inner dielectric spacer portions 562. In one embodiment, the outer dielectric spacer portions 564 may be deposited directly on sidewalls of the top electrodes 558. In one embodiment, each sidewall of the top electrodes 558 may contact a respective outer dielectric spacer portion 564. The maximum thickness of each outer dielectric spacer portion 564 may be in a range from 2 nm to 20 nm, such as from 4 nm to 10 nm, although lesser and greater thicknesses may also be used.

Each combination of an inner dielectric spacer portion 562 and an outer dielectric spacer portion 564 constitutes a dielectric spacer 565. An array of dielectric spacers 565 laterally surrounds the array of memory cells 500. While the present disclosure is described using an embodiment in which a dielectric spacer 565 includes an inner dielectric spacer portion 562 and an outer dielectric spacer portion 564, embodiments are expressly contemplated herein in which a dielectric spacer consists of an inner dielectric spacer portion 562 or consists of an outer dielectric spacer portion 564. Generally, an array of dielectric spacers 565 may be formed around the array of memory cells 500. Each dielectric spacer 565 may be formed directly on, and around, a sidewall of a respective memory cell 500.

Figure 8:
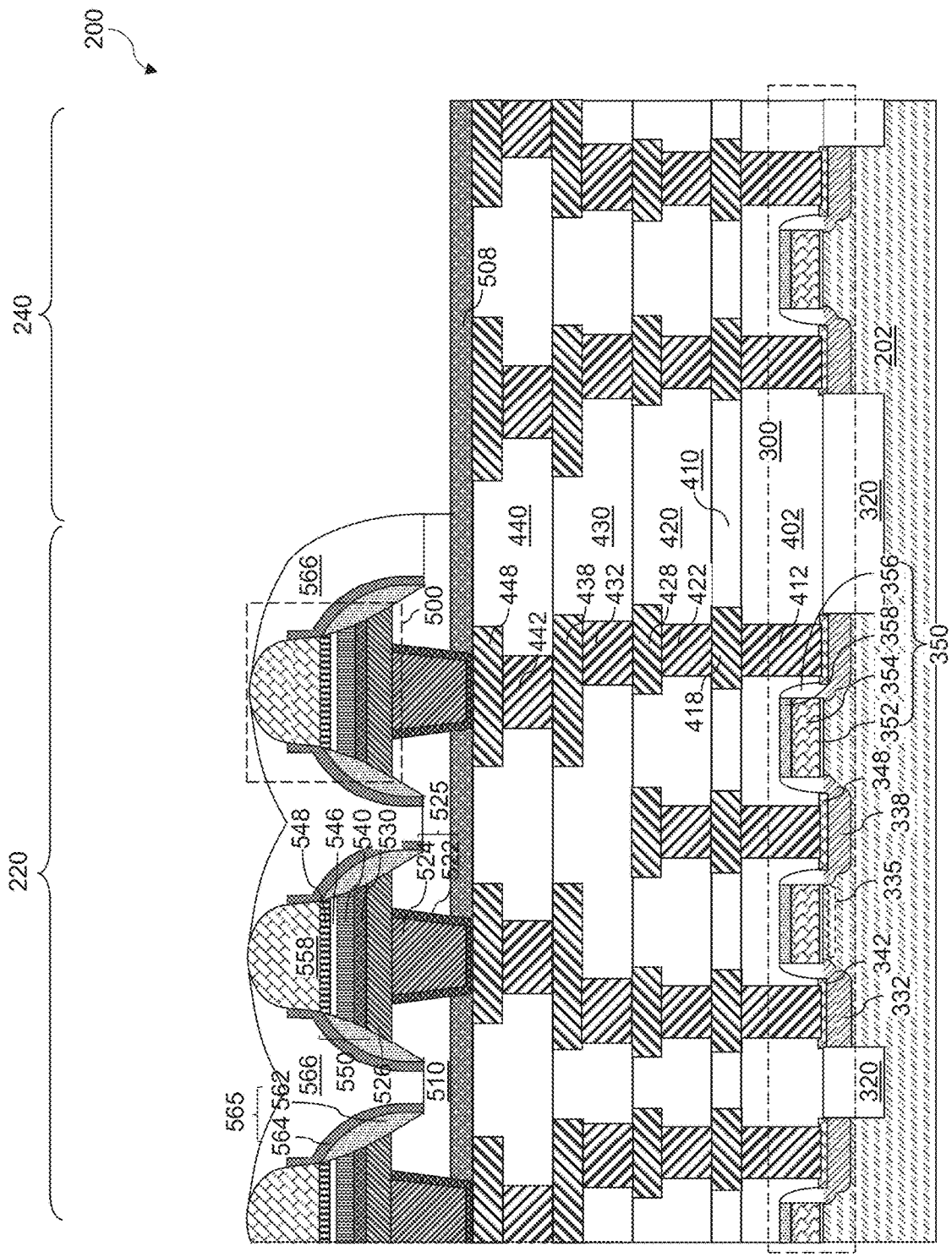

Referring to FIGS. 1 and 8, the method 100 includes a block 114 where a dielectric encapsulation structure is formed over the array of memory cells 500. FIG. 8 is a vertical cross-sectional view of the workpiece 200 after formation of a dielectric encapsulation structure according to an embodiment of the present disclosure. Referring to FIG. 8, a dielectric encapsulation material such as silicon oxide, silicon nitride, or a dielectric metal oxide may be deposited by a conformal deposition process such as an atomic layer deposition process or a chemical vapor deposition process, and may be subsequently anisotropically etched to form a dielectric encapsulation structure 566. In one embodiment, the dielectric encapsulation structure 566 may include silicon oxide. In one embodiment, the thickness of the dielectric encapsulation material may be selected such that volumes between neighboring pairs of memory cells 500 are filled with the dielectric encapsulation material in the memory region 220. In one embodiment, the top surface of the dielectric encapsulation structure 566 may be located above the horizontal plane including the topmost surfaces of the dielectric spacers 565 between each neighboring pair of memory cells 500. In one embodiment, the anisotropic etch process that removes horizontally-extending portions of the dielectric encapsulation material may etch the portion of the connection-via-level dielectric layer 510 in areas that do not underlie the array of memory cells 500 or the dielectric encapsulation structure 566. In this embodiment, the portion of the connection-via-level dielectric layer 510 located in the logic region 240 may be removed by the anisotropic etch process, such that the dielectric cap layer 508 is exposed in the logic region 240.

Figure 9:
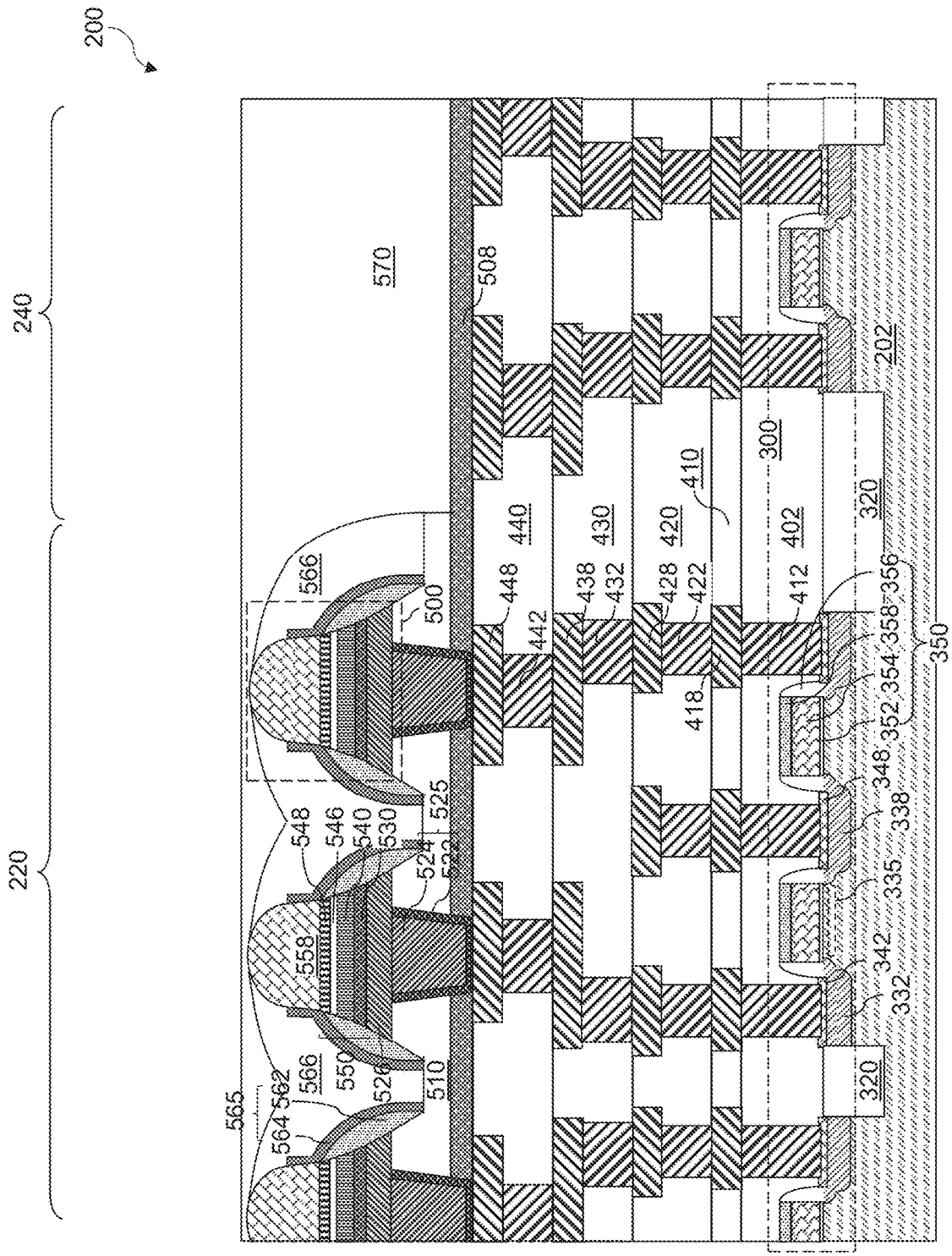
Figure 10:
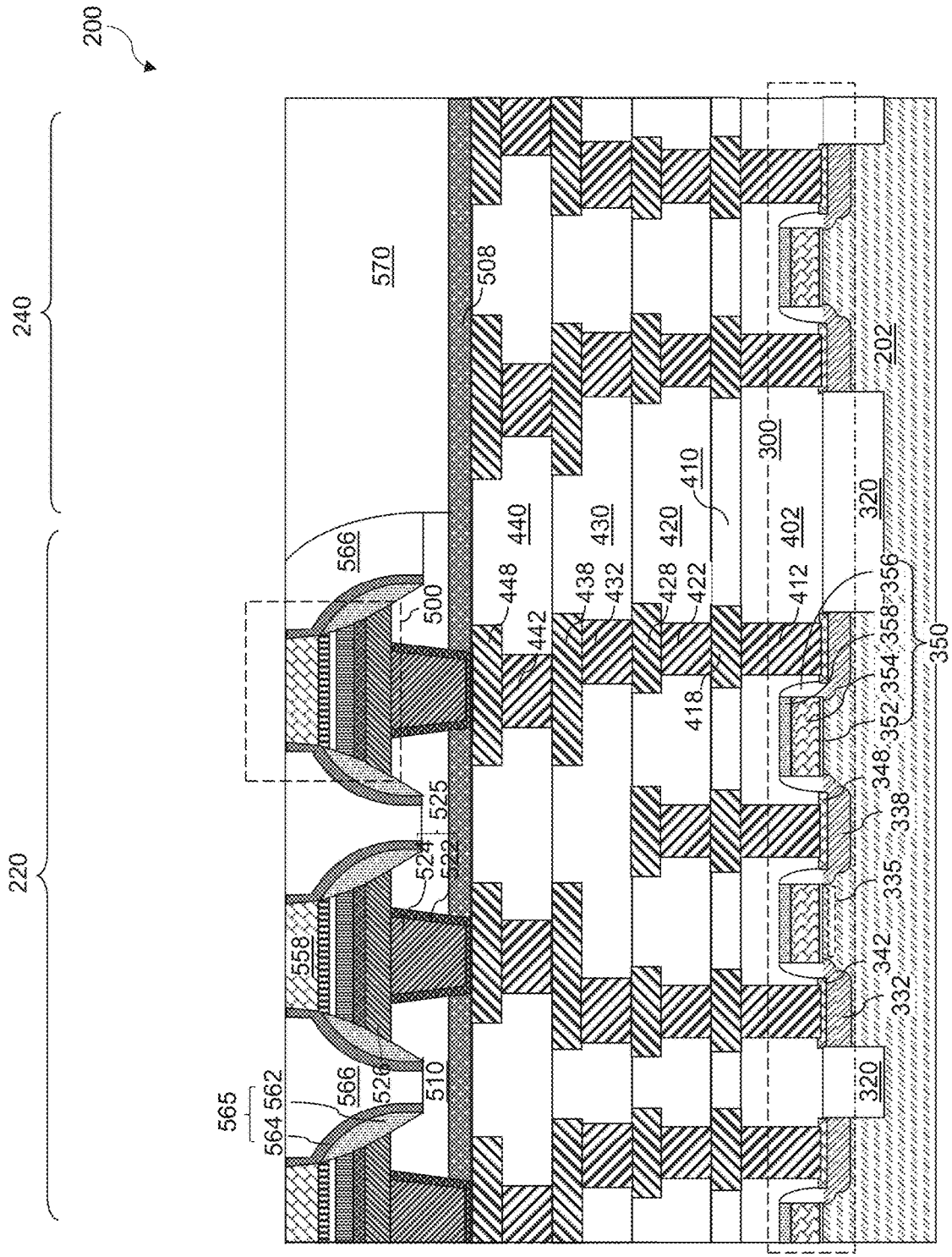
Figure 11:
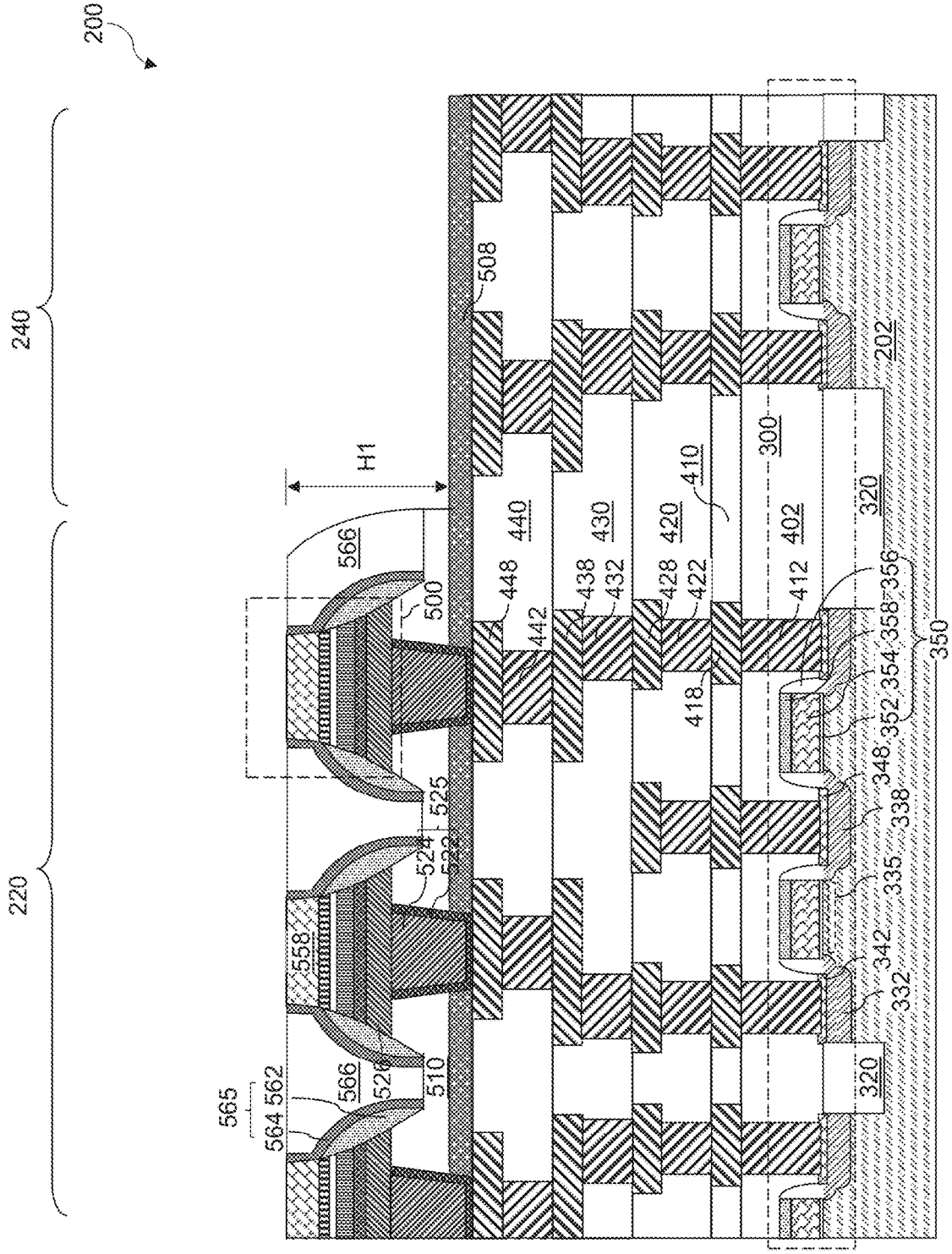

Referring to FIGS. 1 and 9-11, the method 100 includes a block 116 where top electrodes 558 and the dielectric encapsulation structure 566 are planarized. In one embodiment, operations at the block 116 includes depositing a sacrificial dielectric layer over the memory region 220 and the logic region 240, and subsequently performing a planarization process such as a chemical mechanical planarization process to remove excess materials. FIG. 9 is a vertical cross-sectional view of the workpiece 200 after formation of a sacrificial dielectric layer according to an embodiment of the present disclosure. Referring to FIG. 9, a sacrificial dielectric layer 570 may be formed around, and over, the array of dielectric spacers 565 and the dielectric encapsulation structure 566, and over the dielectric cap layer 508. The sacrificial dielectric layer 570 includes a planarizable dielectric material such as undoped silicate glass or a doped silicate glass. The dielectric material of the sacrificial dielectric layer 570 may be deposited by a conformal deposition process (such as a chemical vapor deposition process) or a self-planarizing deposition process (such as spin coating). FIG. 10 is a vertical cross-sectional view of the workpiece 200 after planarization of the top electrodes according to an embodiment of the present disclosure. Referring to FIG. 10, a planarization process such as a chemical mechanical planarization process may be performed to remove excess material of the dielectric encapsulation structure 566 and the sacrificial dielectric layer 570 from above the top surfaces of the top electrodes 558. Further, convex portions of the top electrodes 558 may be polished by continuing the chemical mechanical planarization process so that remaining portions of the top electrodes 558 have horizontal top surfaces. Thus, the sacrificial dielectric layer 570, the dielectric encapsulation structure 566, and the dielectric spacers 565 that protrude above the horizontal plane including the planarized top surfaces of the planarized top electrodes 558 may be removed by the chemical mechanical planarization process. FIG. 11 is a vertical cross-sectional view of the workpiece 200 after removal of the sacrificial dielectric layer 570 according to an embodiment of the present disclosure. In an embodiment, the sacrificial dielectric layer 570 includes a material that has an etch selectivity with respect to the dielectric encapsulation structure 566, the dielectric spacers 565, and the dielectric cap layer 508. Referring to FIG. 11, the sacrificial dielectric layer 570 is removed in a selective etching process (e.g., dry and/or wet etching), such that the dielectric cap layer 508 is exposed in the logic region 240.

The thickness of the top electrodes 558 after the planarization process may have a thickness in a range from 4 nm to 30 nm, such as from 8 nm to 10 nm, although lesser and greater thicknesses may also be used. The top surfaces of the top electrodes 558 may be located within the horizontal plane including the top surface of dielectric encapsulation structure 566. A vertical distance H1 between the top surfaces of the top electrodes 558 and the top surface of the dielectric cap layer 508 may range from 50 nm to 100 nm, although lesser and greater thicknesses may also be used.

Figure 12:
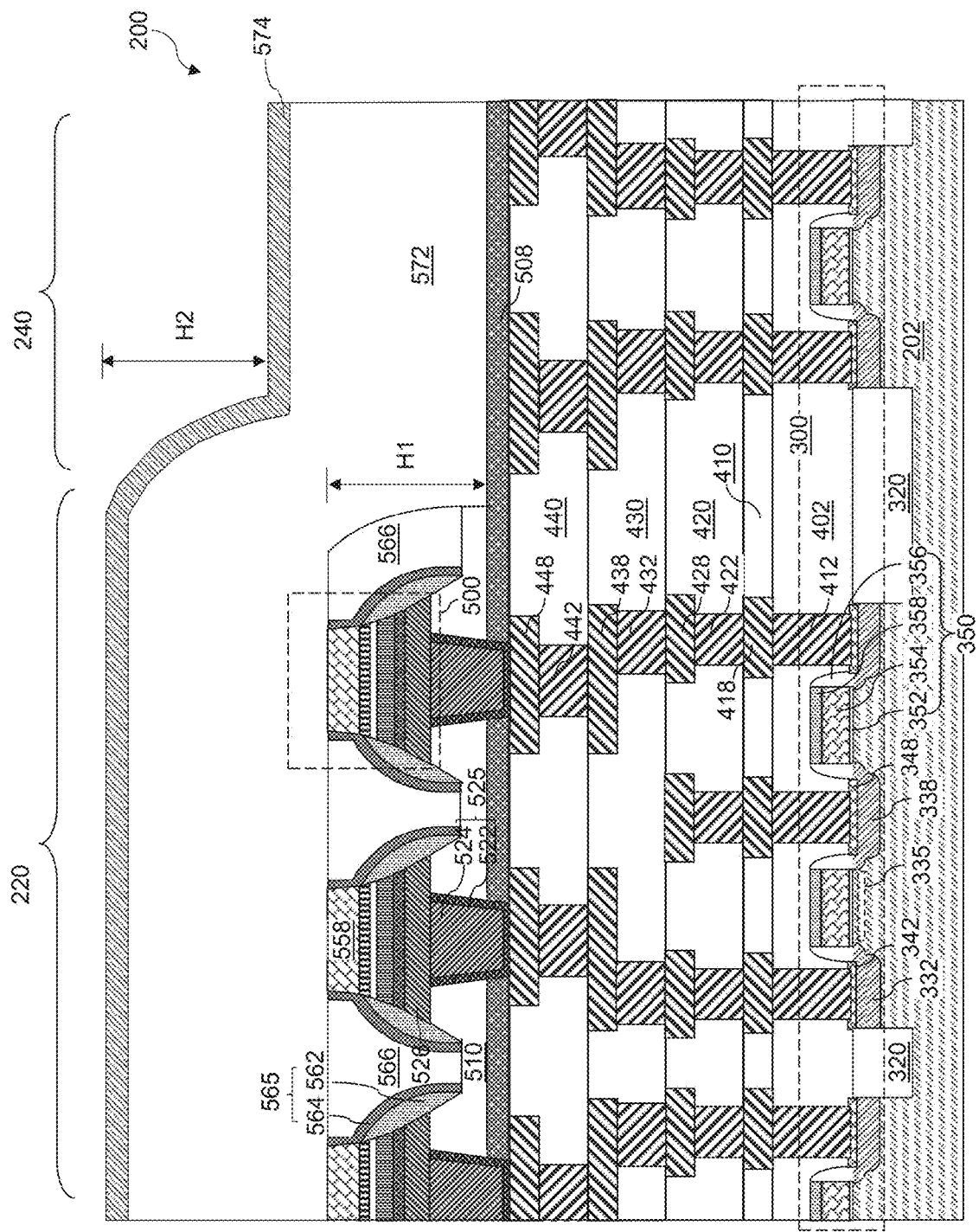

Referring to FIGS. 1 and 12, the method 100 includes a block 118 where a memory-level dielectric layer and an anti-reflection layer are formed in the memory region 220 and logic region 240. FIG. 12 is a vertical cross-sectional view of the workpiece 200 after formation of a memory-level dielectric layer and an anti-reflection layer according to an embodiment of the present disclosure. Referring to FIG. 12, a memory-level dielectric layer 572 may be formed around, and over the array of memory cells 500, the dielectric encapsulation structure 566, and over the dielectric cap layer 508, and an anti-reflection layer 574 is deposited on the top surface of the memory-level dielectric layer 572. In one embodiment, the memory-level dielectric layer 572 is a low-k dielectric layer, including one or more oxide based dielectric materials such as silicon dioxide, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In one embodiment, the anti-reflection layer 574 is a nitrogen-free anti-reflection layer (NFARL). The memory-level dielectric layer 572 and the anti-reflection layer 574 may be deposited using ALD, CVD, PVD, or other suitable methods. The memory-level dielectric layer 572 may be deposited generally conformal to the topography of the workpiece 200 and the anti-reflection layer 574 is conformally deposited on the memory-level dielectric layer 572. Thus, due to the underlying array of memory cells 500 that rises above the dielectric cap layer 508, portions of the top surface of the anti-reflection layer 574 in the memory region 220 are above other portions in the logic region 240 for a vertical distance H2 that roughly equals H1, such as from 50 nm to 100 nm in one embodiment.

Figure 13:
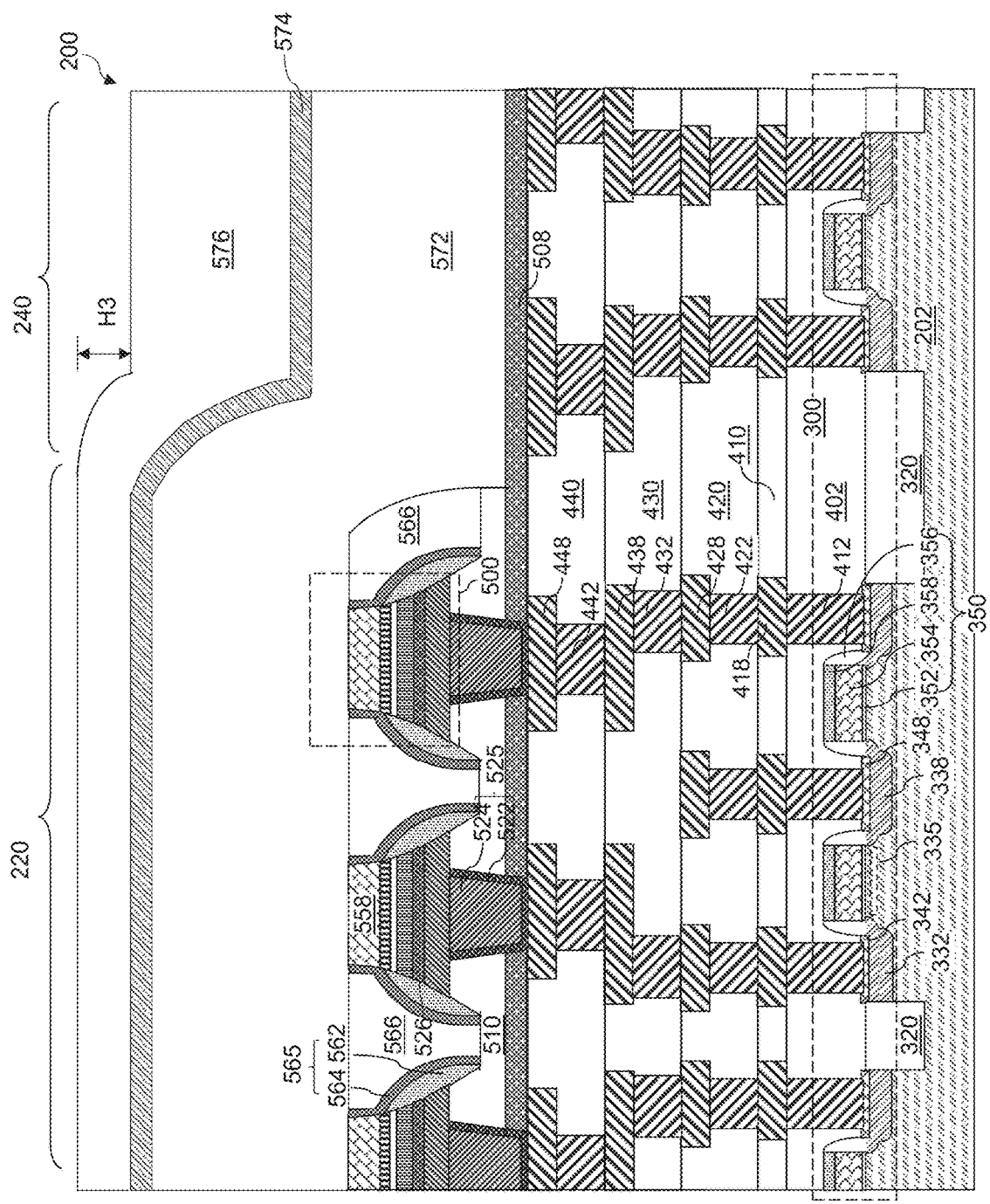
Figure 14:
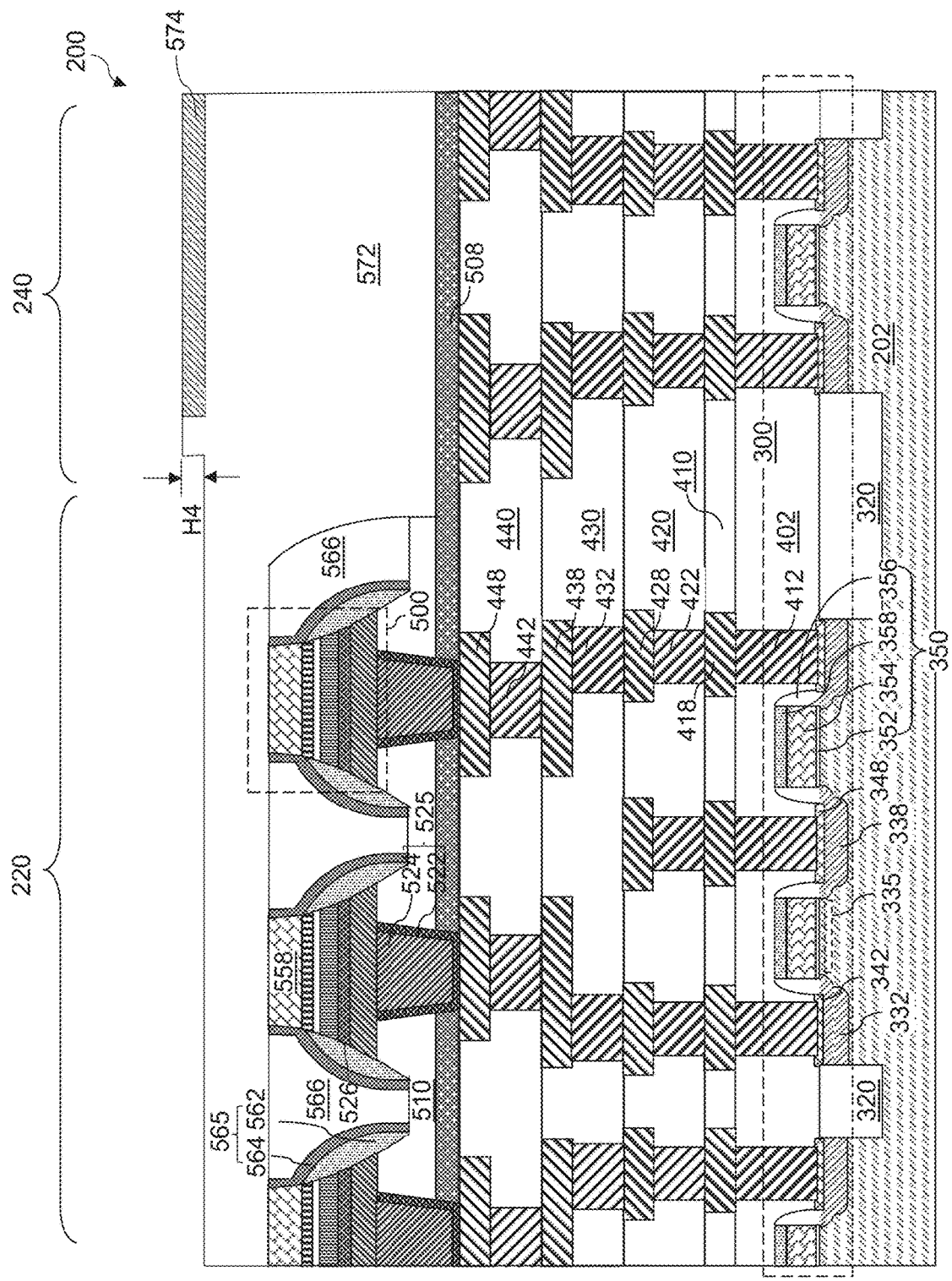

Referring to FIGS. 1, 13, and 14, the method 100 includes a block 120 where a resist layer is deposited in the memory region 220 and the logic region 240 and the memory-level dielectric layer 572 is recessed in the memory region 220. FIG. 13 is a vertical cross-sectional view of the workpiece 200 after the resist layer is deposited according to an embodiment of the present disclosure. Referring to FIG. 13, a resist layer 576 may be applied over the anti-reflection layer 574. The resist layer 576 includes a planarizable material, such as photoresist material in some embodiments. The photoresist material of the resist layer 576 may be deposited by a self-planarizing deposition process (such as spin coating). Due to the self-planarizing deposition process, the resist layer 576 has a larger thickness in the logic region 240 than in the memory region 220, such that a vertical distance H3 between portions of the top surface of the resist layer 576 across the memory region 220 and the logic region 240 is smaller than H1 and H2, such as less than 50 nm in one embodiment.

FIG. 14 is a vertical cross-sectional view of the workpiece 200 after an anisotropic etch process is performed to recess the memory-level dielectric layer 572 in the memory region 220. Referring to FIG. 14, the anisotropic etch process is a maskless etch process. That is, the anisotropic etch process is applied to both the memory region 220 and the logic region 240 without using an etch mask. The etchant is selected such that the memory-level dielectric layer 572 has a larger etch rate than the resist layer 576. Since the resist layer 576 is thinner in the memory region 220, the etchant reaches the anti-reflection layer 574 and subsequently reaches the memory-level dielectric layer 572 in the memory region 220, when the resist layer 576 still covers the anti-reflection layer 574 in the logic region 240. The anisotropic etch process may be controlled by a time mode or an end mode, such that when the resist layer 576 is completely removed and thus the anti-reflection layer 574 is exposed in the logic region 240, the anisotropic etch process stops. A top portion of the memory-level dielectric layer 572 in the memory region 220 is recessed and the memory-level dielectric layer 572 in the logic region 240 remains intact under the anti-reflection layer 574. A vertical distance H4 between portions of the top surface of the workpiece 200 across the memory region 220 and the logic region 240 is smaller than H3, such as less than 10 nm in one embodiment. By implementing a maskless etch process during operations at the block 120, manufacturing cost is reduced by saving mask fabrication costs.

Figure 15:
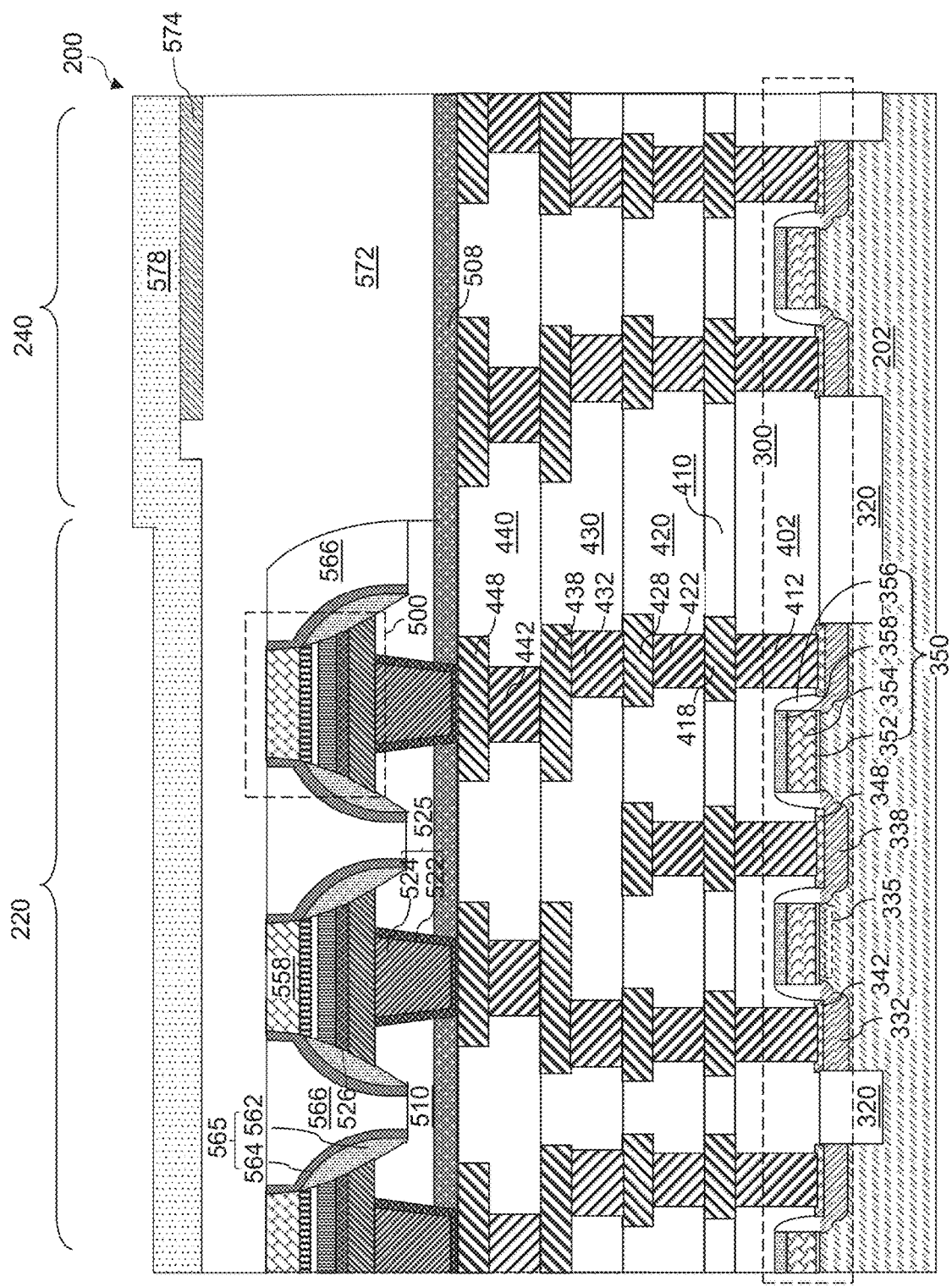

Referring to FIGS. 1 and 15, the method 100 includes a block 122 where a sacrificial barrier layer is formed. FIG. 15 is a vertical cross-sectional view of the workpiece 200 after formation of a sacrificial barrier layer. Referring to FIG. 15, a sacrificial barrier layer 578 is conformally deposited on the top surfaces of the memory-level dielectric layer 572 and the anti-reflection layer 574. The sacrificial barrier layer 578 provides high etch selectivity in subsequent patterning processes allowing protections of underneath material layers from etching damages. The sacrificial barrier layer 578 may include a conductive metallic nitride such as TiN, TaN, and/or WN. Other suitable materials within the contemplated scope of disclosure may also be used. The thickness of the sacrificial barrier layer 578 may be in a range from 3 nm to 20 nm, although lesser and greater thicknesses may also be used.

Figure 16:
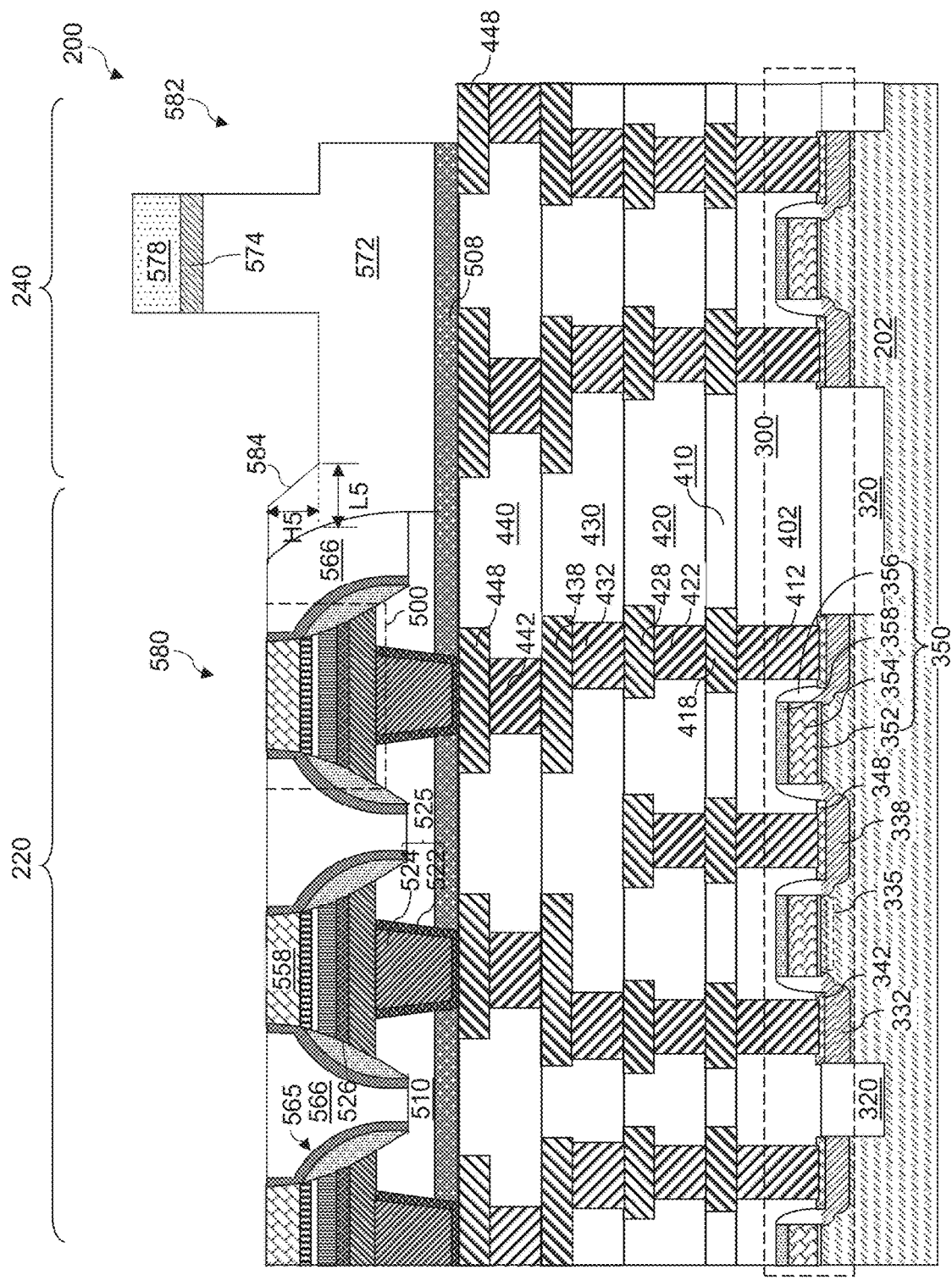

Referring to FIGS. 1 and 16, the method 100 includes a block 124 where metal line cavities and integrated line-and-via cavities are formed in the memory-level dielectric layer 572. FIG. 16 is a vertical cross-sectional view of the workpiece 200 after formation of an exemplary metal line cavity 580 and an exemplary integrated line-and-via cavity 582 in the memory-level dielectric layer 572 according to an embodiment of the present disclosure. Referring to FIG. 16, multiple lithographic patterning steps and multiple anisotropic etch processes may be used for forming via portion (lower portion) of the integrated line-and-via cavity 582 in the memory-level dielectric layer 572, and subsequently the metal line cavity 580 and line portion (upper portion) of the integrated line-and-via cavity 582 in the memory-level dielectric layer 572. For example, a first photoresist layer (not shown) may be applied over the sacrificial barrier layer 578 and may be lithographically patterned to form via opening in the logic region 240. The via opening overlays the underneath fourth metal line structures 448. A first anisotropic etch process may be performed to form via opening through the memory-level dielectric layer 572 in the logic region 240, such that the top surface of the respective fourth metal line structure 448 is exposed. The first photoresist layer may be subsequently removed, for example, by ashing. After removal of the first photoresist layer, a second photoresist layer (not shown) may be applied over the sacrificial barrier layer 578 and may be lithographically patterned to form rows of elongated openings in the second photoresist layer in the memory region 220. The elongated openings may be rectangular opening that laterally extend along the horizontal direction of rows of memory cells 500. The lithographic patterning also creates openings in the second photoresist layer in the logic region 240 overlaying the via opening. A second anisotropic etch process may be performed to form the metal line cavity 580 and the line portion of the integrated line-and-via cavity 582 in the memory-level dielectric layer 572. In the memory region 220, the top surface of the memory cells 500 comprising the top electrodes 558, the dielectric spacers 565, and the dielectric encapsulation structure 566 functions as an etch stop layer, such that the second anisotropic etch process stops at this top surface. As a comparison, the memory-level dielectric layer 572 in the logic region 240 is further recessed, resulting in a tapered sidewall 584 across the memory region 220 and the logic region 240 having a taper angle (with respective to a vertical direction) in a range from 30 degrees to 80 degrees. A vertical distance H5 between portions of the top surface of the metal line cavity 580 in the memory region 220 and in the logic region 240 ranges from 1 nm to 50 nm. A lateral distance L5 between a footing of the tapered sidewall 584 and the dielectric encapsulation structure 566 ranges from 50 nm to 500 nm. The second photoresist layer may be subsequently removed, for example, by ashing.

In the logic region 240, the line opening and the via opening adjoin to form the integrated line-and-via cavity 582. A top surface of an underlying metal interconnect structure, such as a fourth metal line structure 448 embedded in an upper portion of the fourth line-and-via-level dielectric material layer 440, may be physically exposed at the bottom of at least a subset of the integrated line-and-via cavities 582 in the memory-level dielectric layer 572. Generally, at least a subset of the integrated line-and-via cavities 582 vertically extends between the top surface of the memory-level dielectric layer 572 and the top surfaces of an underlying metal line structure may be formed through the memory-level dielectric layer 572.

Figure 17:
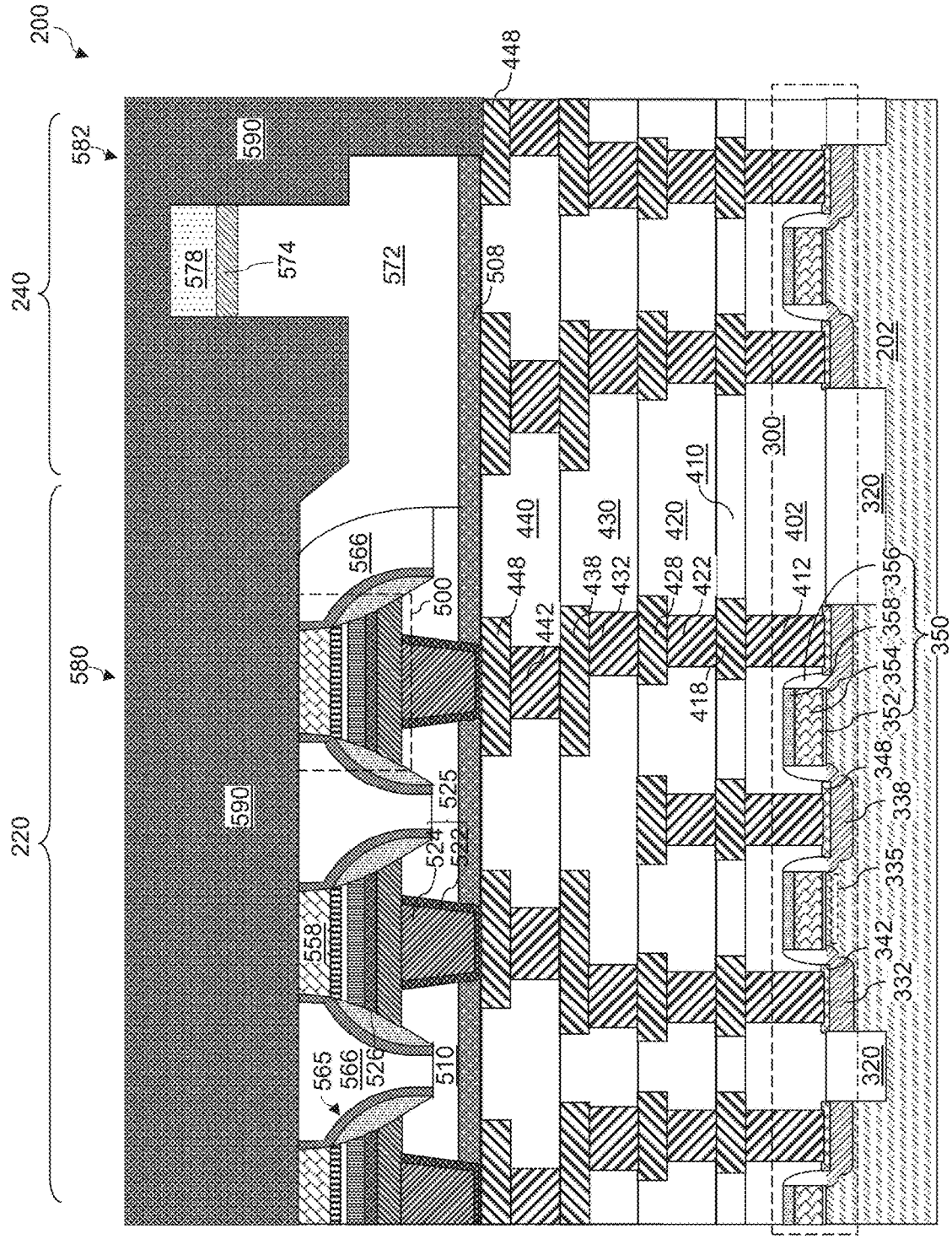
Figure 18:
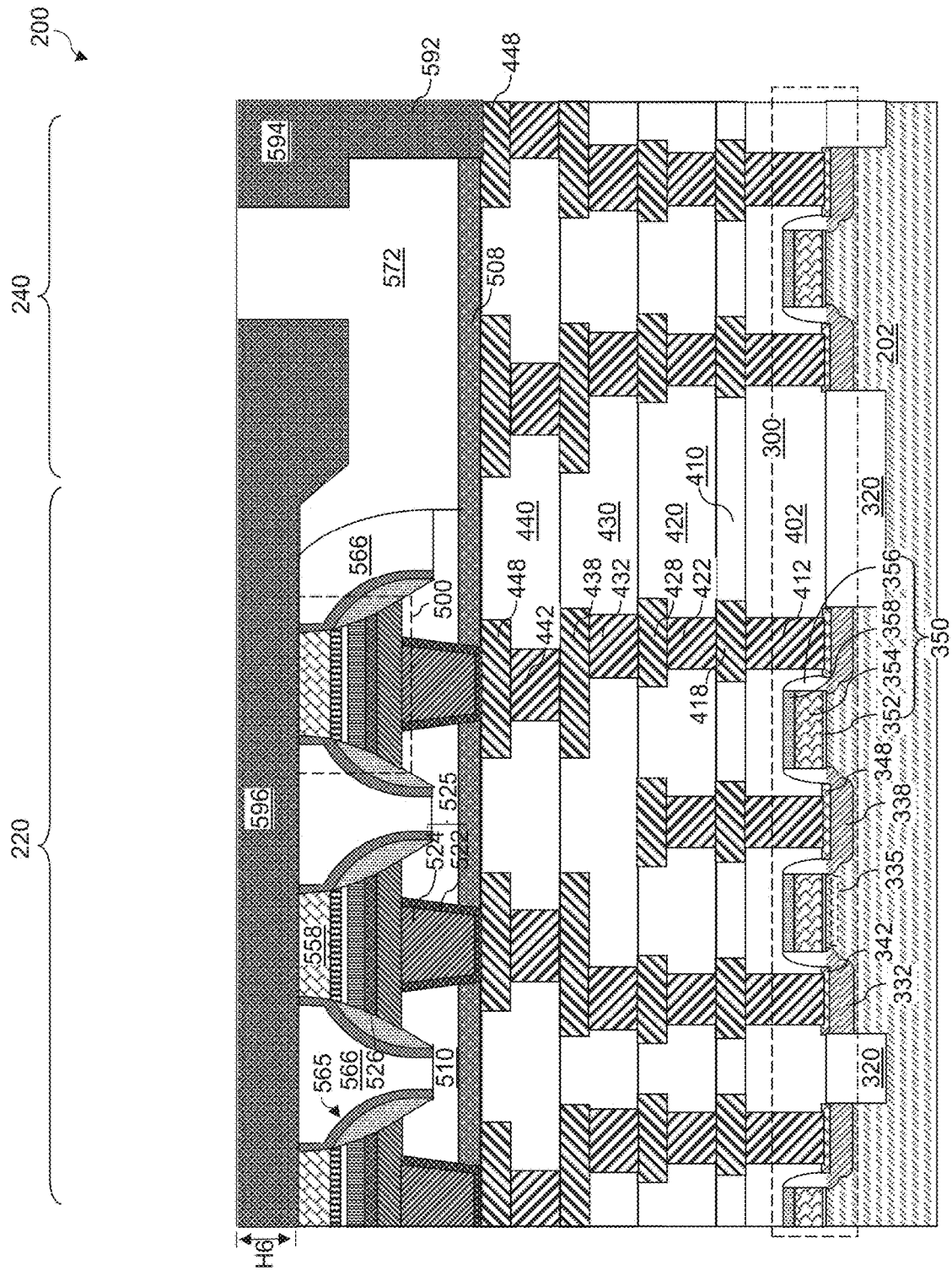

Referring to FIGS. 1, 17, and 18, the method 100 includes a block 126 where a fifth metal line structure is formed as a common electrode for the array of memory cells 500. FIG. 17 is a vertical cross-sectional view of the workpiece 200 after formation of top-interconnection metal layer 590 according to an embodiment of the present disclosure. Referring to FIG. 17, at least one metallic material is deposited to fill the metal line cavity 580 and the integrated line-and-via cavity 582, and over the sacrificial barrier layer 578. The top-interconnection metal layer 590 may include a metallic barrier material (such as TiN, TaN, and/or WN) and a metallic fill material (such as Cu, Co, Ru, Mo, W, or an intermetallic alloy) deposited by ALD, PVD, CVD, e-beam evaporation, or other suitable processes. Other suitable metallic materials are within the contemplated scope of disclosure. FIG. 18 is a vertical cross-sectional view of the workpiece 200 after excess portions of the top-interconnection metal layer 590 are removed. Referring to FIG. 18, the sacrificial barrier layer 578 and the anti-reflection layer 574 are also removed exposing the memory-level dielectric layer 572. Each remaining portion of the top-interconnection metal layer 590 that fills a respective one of the metal line cavities 580 constitutes a common electrode 596 that provides electrical interconnection between the top electrodes 558 within a respective row of memory cells 500. The common electrode 596 is a metal line, particularly a fifth metal line structure 596 in the illustrated embodiment. The thickness H6 of the common electrode 596 in the memory region 220 may be in a range from 10 nm to 50 nm, such as from 20 nm to 30 nm, although lesser and greater heights may also be used. The fifth metal line structure 594 extends to the logic region 240 with a thickness of 1 nm to 50 nm larger (H5 as discussed above). Each remaining portion of the top-interconnection metal layer 590 that fills a respective one of the integrated line-and-via cavity 582 constitutes a metal line structure 594, particularly a fifth metal line structure in the illustrated embodiment, and a metal via structure 592, particularly a fifth metal via structure.

Figure 19:
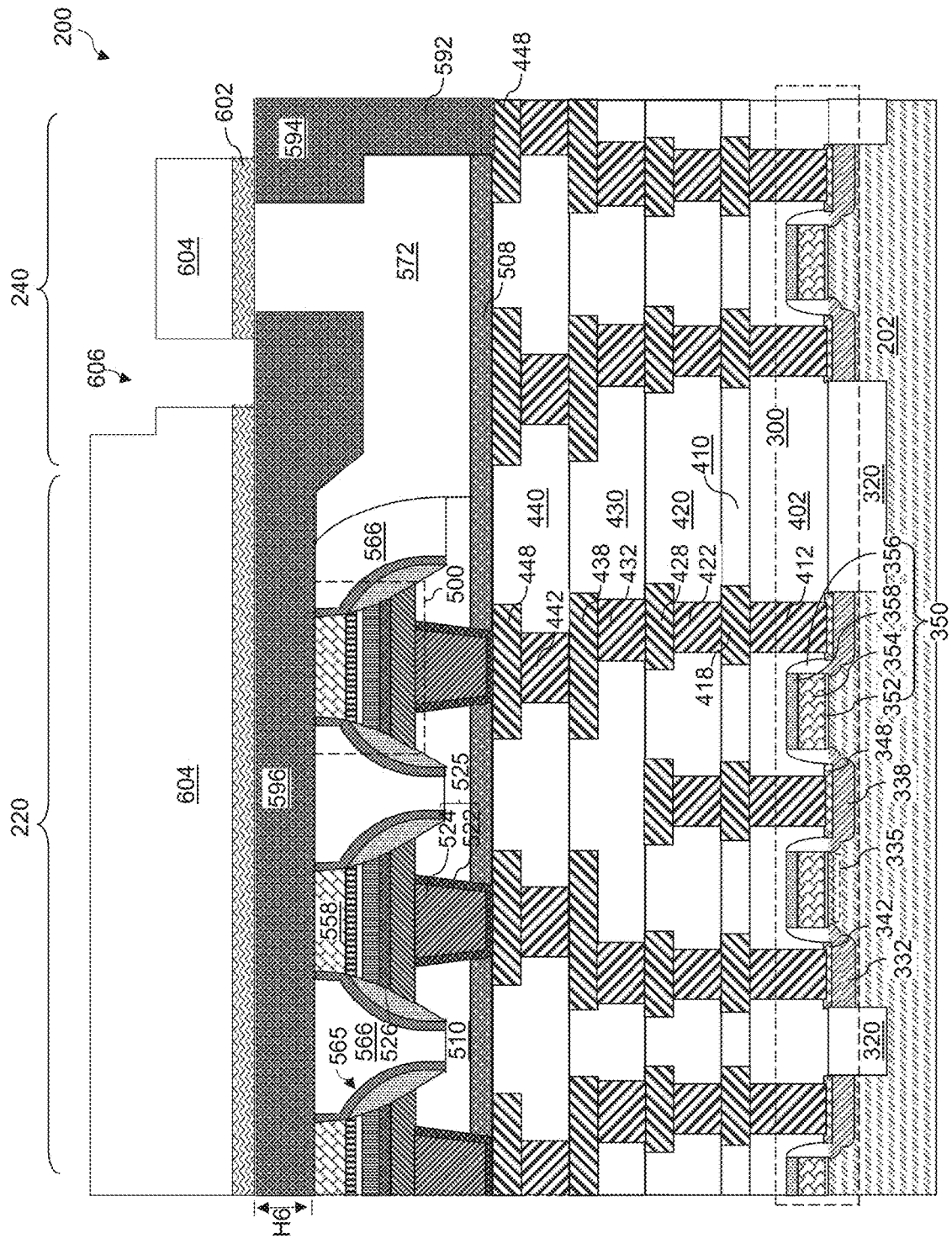

Referring to FIGS. 1 and 19, the method 100 includes a block 128 where integrated line-and-via cavities are formed in an upper-level dielectric layer in the logic region 240. FIG. 19 is a vertical cross-sectional view of the workpiece 200 after deposition and planarization of an upper-level dielectric layer 604 according to an embodiment of the present disclosure. Referring to FIG. 19, at least one upper-level dielectric layer 604 may be formed over an upper-level etch stop dielectric layer 602. The upper-level etch stop dielectric layer 602 includes an etch stop material such as silicon nitride, silicon carbide, silicon nitride carbide, or a dielectric metal oxide (such as aluminum oxide, titanium oxide, tantalum oxide, etc.). The upper-level etch stop dielectric layer 602 contacts the top surface of the fifth metal line structures 594 and 596 and the memory-level dielectric layer 572. The thickness of the upper-level etch stop dielectric layer 602 may be in a range from 4 nm to 20 nm, such as from 6 nm to 10 nm, although lesser and greater thicknesses may also be used. The upper-level dielectric layer 604 may include, for example, undoped silicate glass, a doped silicate glass, spin-on-glass, porous or non-porous organosilicate glass, silicon nitride, silicon oxynitride, silicon carbide, silicon carbide nitride, or combinations thereof. The dielectric material of the upper-level dielectric layer 604 may be self-planarizing, or may be planarized by a planarization process such as a chemical mechanical planarization process. The thickness of the upper-level dielectric layer 604 may be in a range from 40 nm to 500 nm, such as from 80 nm to 300 nm, although lesser and greater thicknesses may also be used. Subsequently, lithographic patterning steps and anisotropic etch processes may be used for form integrated line-and via cavities 606. The formation of the integrated line-and-via cavities 606 may be similar to the formation of the integration line-and-via 582 as described above (FIG. 16). After the formation of the integrated line-and-via cavities 606, the top surfaces of the fifth metal line structures 594 and 596 are exposed in respective via openings (lower portions) of the integrated line-and-via cavities 606.

Figure 20:
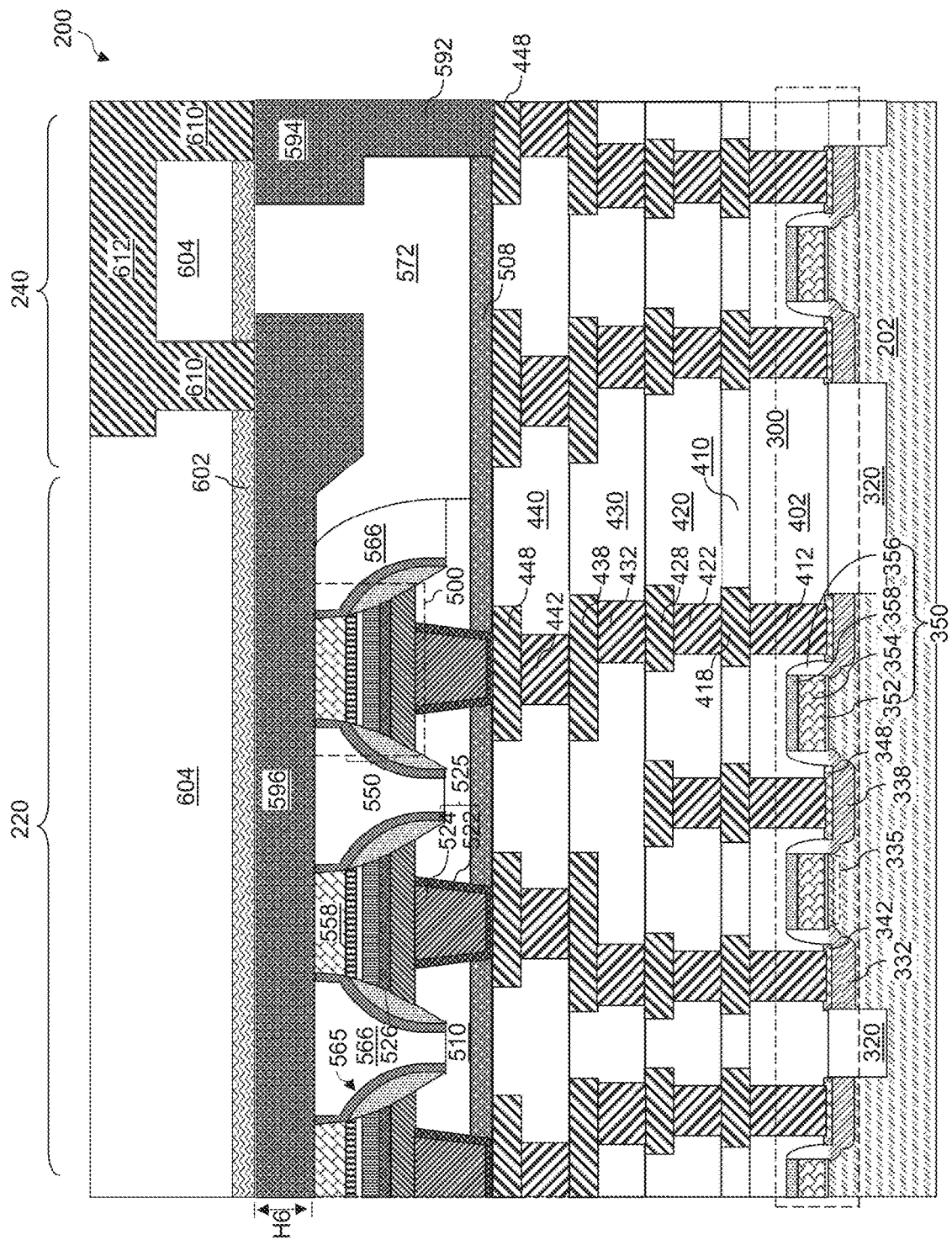

Referring to FIGS. 1 and 20, the method 100 includes a block 130 where upper metal interconnect structures are formed. FIG. 20 is a vertical cross-sectional view of the workpiece 200 after formation of upper metal interconnect structures according to an embodiment of the present disclosure. Referring to FIG. 20, at least one metallic material may be deposited in the integrated line-and-via cavities 606. The at least one metallic material is herein referred to as at least one upper-level metallic material. In one embodiment, a metallic barrier material layer (such as a TiN, layer, TaN layer, and/or a WN layer) and a metallic fill material (such as W, Cu, Co, Ru, Mo, or an intermetallic alloy) may be deposited in the integrated line-and-via cavities 606 and contacts top surfaces of the fifth metal line structures 594 and 596 in the logic region 240. A planarization process such as a chemical mechanical planarization process may be performed to remove the at least one upper-level metallic material from the upper-level dielectric layer 604. Remaining portions of the at least one upper-level metallic material filling the upper portion of the integrated line-and-via cavities 606 comprises metal line structures 612, particularly a sixth metal line structure in the illustrated embodiment. Remaining portions of the at least one upper-level metallic material filling the lower portion of the integrated line-and-via cavities 606 comprises metal via structures 610, particularly sixth metal vias structure in the illustrated embodiment. The metal via structures 610 and the metal line structures 612 are embedded in the upper-level dielectric layer 604, forming a sixth layer of the interconnection structures of the workpiece 200.

Referring collectively to FIGS. 1-20 and according to various embodiments of the present disclosure, a memory array device is provided, which may be, for example, a magnetic tunnel junction memory device. The memory array device includes an array of memory cells 500 located over a substrate 202, wherein each of the memory cells 500 comprises, from bottom to top, a bottom electrode 526, a magnetic tunnel junction 550, and a top electrode 558. A memory-level dielectric layer 572 laterally surrounding the array of memory cells 500. Top surfaces of the top electrodes 558 are located within a horizontal plane including a top surface of the memory-level dielectric layer 572. A metal line 596 laterally extending along a horizontal direction and contacting a respective row of top electrodes 558 within a horizontal plane including a top surface of the memory-level dielectric layer 572. The metal line 596, particularly a fifth metal line in the interconnection structures in the illustrated embodiment, functions as a common top electrode, without a need of top electrode vias. The metal line 596 further extends to the logic region 240. An upper metal line 612, particularly a sixth metal line in the interconnection structures in the illustrated embodiment, is coupled to the metal line 596 through a metal via 610 in the logic region 240 and provides electrical coupling between the memory array and logic control circuits in the CMOS circuitry 300. As a common electrode is larger than a single top electrode, the issue associated with satisfactorily aligning landing vias with top electrodes may be resolved. By implementing the method of the present disclosure, process of fabricating the memory device is advantageously simplified, resulting in reduced fabrication cost and improved yield.

In one exemplary aspect, the present disclosure is directed to a method of manufacturing a memory array device. The method includes providing a substrate, the substrate having a first region and a second region, and forming an array of memory cells over the first region of the substrate, each of the memory cells including, from bottom to top, a bottom electrode, a memory material layer stack, and a top electrode. The method also includes forming a memory-level dielectric layer around the array of memory cells, and forming a metal line directly interfacing a respective row of top electrodes of the array of memory cells, the metal line also directly interfacing a top surface of the memory-level dielectric layer. In some embodiments, the first region is a memory region and the second region is a logic region, and the metal line extends into the second region. In some embodiments, the metal line has a larger thickness in the second region than in the first region. In some embodiments, the method also includes forming a sacrificial dielectric layer over the first and second regions, the sacrificial dielectric layer covering the array of memory cells, planarizing the top electrodes of the array of memory cells, and removing the sacrificial dielectric layer from the first and second regions. In some embodiments, the method also includes forming a dielectric encapsulation structure prior to the forming of the sacrificial dielectric layer. The dielectric encapsulation structure covers the array of memory cells, and the planarizing of the top electrodes of the array of memory cells exposes the top electrodes from the sacrificial dielectric layer. In some embodiments, an interface between the metal line and the respective row of the top electrodes is within a horizontal plane including the top surface of the memory-level dielectric layer. In some embodiments, the forming of the metal line includes forming elongated cavities in the memory-level dielectric layer, the elongated cavities exposing the top electrodes of the array of memory cells, depositing a metallic material in the elongated cavities, and removing portions of the metallic material from above the memory-level dielectric layer, wherein remaining portions of the metallic material comprise the metal line. In some embodiments, the remaining portions of the metallic material also comprise a metal via in the second region. In some embodiments, the forming of the memory-level dielectric layer includes depositing a dielectric material over the first and second regions, a first portion of the dielectric material in the first region being higher than a second portion of the dielectric material in the second region, and recessing the first portion of the dielectric material in an etching process, while the second portion of the dielectric material remains intact. In some embodiments, after the recessing of the first portion of the dielectric material, the first portion of the dielectric material is lower than the second portion of the dielectric material.

In another exemplary aspect, the present disclosure is directed to a method. The method includes forming an array of memory cells over a substrate, each of the memory cells including a bottom electrode, a magnetic tunnel junction, and a top electrode, depositing an encapsulation layer covering the array of memory cells, performing a planarization process, thereby exposing top electrodes of the array of memory cells from the encapsulation layer, depositing a dielectric layer covering the top electrodes and the encapsulation layer, forming a cavity in the dielectric layer, thereby exposing a row of the top electrodes, and forming a metal line in the cavity, the metal line contacting the row of the top electrodes. In some embodiments, a bottom surface of the cavity has a portion offset from the encapsulation layer, and the portion of the bottom surface of the cavity is below a top surface of the top electrodes. In some embodiments, a bottom surface of the metal line has a portion offset from the array of memory cells, and the portion of the bottom surface of the metal line is below a bottom surface of the top electrodes. In some embodiments, the method also includes forming a via landing on the metal line, the via being offset from the array of memory cells. In some embodiments, a portion of the metal line where the via lands is thicker than another portion of the metal line directly above the row of the top electrodes. In some embodiments, the method also includes forming an anti-reflection layer above the dielectric layer, and performing a maskless etching process, such that a portion of the dielectric layer directly above the array of memory cells is recessed, while another portion of the dielectric layer offset from the array of memory cells remains intact under the anti-reflection layer.

In another exemplary aspect, the present disclosure is directed to a semiconductor structure. The semiconductor structure includes a memory region. The memory region includes a dielectric layer, a row of memory cells disposed in the dielectric layer, each of the memory cells including a top electrode, a common top electrode directly interfacing the dielectric layer and top electrodes of the row of memory cells, and an etch stop layer disposed directly on the dielectric layer and the common top electrode. In some embodiments, the semiconductor structure also includes a logic region. The logic region includes a transistor directly under the dielectric layer, the common top electrode extending into the logic region and electrically coupled to the transistor. In some embodiments, the common top electrode has a larger thickness in the logic region than in the memory region. In some embodiments, the logic region also includes a via through the etch stop layer and landing on the common top electrode.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a memory array device, comprising:
    providing a substrate, wherein the substrate has a first region and a second region; forming an array of memory cells over the first region of the substrate, wherein each of the memory cells includes, from bottom to top, a bottom electrode, a memory material layer stack, and a top electrode;
    forming a memory-level dielectric layer around the array of memory cells; and
    forming elongated cavities in the memory-level dielectric layer, wherein the elongated cavities expose the top electrodes of the array of memory cells;
    depositing a metallic material in the elongated cavities;
    forming a metal line, wherein a bottom surface of the metal line has a continuously flat portion, wherein the continuously flat portion of the bottom surface directly interfaces a respective row of top electrodes of the array of memory cells, wherein the metal line also directly interfaces a top surface of the memory-level dielectric layer.

2. The method of claim 1, wherein the first region is a memory region and the second region is a logic region, and wherein the metal line extends into the second region.

3. The method of claim 2, wherein the metal line has a larger thickness in the second region than in the first region.

4. The method of claim 1, further comprising:
    forming a sacrificial dielectric layer over the first and second regions, wherein the sacrificial dielectric layer covers the array of memory cells;
    planarizing the top electrodes of the array of memory cells; and
    removing the sacrificial dielectric layer from the first and second regions.

5. The method of claim 4, further comprising:
    forming a dielectric encapsulation structure prior to the forming of the sacrificial dielectric layer,
    wherein the dielectric encapsulation structure covers the array of memory cells, and wherein the planarizing of the top electrodes of the array of memory cells exposes the top electrodes from the sacrificial dielectric layer.

6. The method of claim 1, wherein an interface between the metal line and the respective row of the top electrodes is within a horizontal plane including the top surface of the memory-level dielectric layer.

7. The method of claim 1, wherein the forming of the metal line includes:
    removing portions of the metallic material from above the memory-level dielectric layer, wherein remaining portions of the metallic material comprise the metal line.

8. The method of claim 7, wherein the remaining portions of the metallic material also comprise a metal via in the second region.

9. The method of claim 1, wherein the forming of the memory-level dielectric layer includes:
    depositing a dielectric material over the first and second regions, wherein a first portion of the dielectric material in the first region is higher than a second portion of the dielectric material in the second region; and recessing the first portion of the dielectric material in an etching process, while the second portion of the dielectric material remains intact.

10. The method of claim 9, wherein after the recessing of the first portion of the dielectric material, the first portion of the dielectric material is lower than the second portion of the dielectric material.

11. A method, comprising:
forming an array of memory cells over a substrate, each of the memory cells including a bottom electrode, a magnetic tunnel junction, and a top electrode;
depositing an encapsulation layer covering the array of memory cells;
performing a planarization process, thereby exposing top electrodes of the array of memory cells from the encapsulation layer;
depositing a dielectric layer covering the top electrodes and the encapsulation layer;
forming a cavity in the dielectric layer, thereby exposing a row of the top electrodes; and
forming a metal line in the cavity, the metal line having a portion of a bottom surface that is continuously flat and physically contacting the row of the top electrodes.

12. The method of claim 11, wherein a bottom surface of the cavity has a portion offset from the encapsulation layer, and wherein the portion of the bottom surface of the cavity is below a top surface of the top electrodes.

13. The method of claim 11, wherein a bottom surface of the metal line has a portion offset from the array of memory cells, and wherein the portion of the bottom surface of the metal line is below a bottom surface of the top electrodes.

14. The method of claim 11, further comprising:
forming a via landing on the metal line, wherein the via is offset from the array of memory cells.

15. The method of claim 14, wherein a portion of the metal line where the via lands is thicker than another portion of the metal line directly above the row of the top electrodes.

16. The method of claim 11, further comprising:
forming an anti-reflection layer above the dielectric layer; and
performing a maskless etching process, such that a portion of the dielectric layer directly above the array of memory cells is recessed, while another portion of the dielectric layer offset from the array of memory cells remains intact under the anti-reflection layer.

17. A method, comprising: forming a dielectric cap layer over a substrate, the substrate having a memory region and a logic region, the dielectric cap layer extending from the memory region to the logic region;
forming a plurality of memory cells overlying the dielectric cap layer in the memory region, each of the memory cells including a top electrode;
forming dielectric spacers on sidewalls of the memory cells;
depositing an encapsulation layer covering the dielectric spacers and the top electrodes of the memory cells;
performing an etching process to expose the dielectric cap layer in the logic region, while the encapsulation layer in the memory region remains;
removing a portion of the encapsulation layer to expose the top electrodes of the memory cells;
depositing a dielectric layer in physical contact with the top electrodes of the memory cells in the memory region and the dielectric cap layer in the logic region, the dielectric layer covering the encapsulation layer;
forming elongated cavities in the memory-level dielectric layer, wherein the elongated cavities expose the top electrodes of the array of memory cells;
depositing a metallic material in the elongated cavities;
and forming a metal line in the elongated cavities, the metalline has a portion of a bottom surface that is continuously flat and physically contacting the top electrodes of the memory cells.

18. The method of claim 17, wherein after the depositing of the dielectric layer, a top surface of the dielectric layer is non-flat.

19. The method of claim 17, wherein after a bottom surface of the elongated cavities is lower in the logic region than in the memory region.

20. The method of claim 17, wherein the forming of the elongated cavities includes etching the dielectric layer in a maskless etching process.

* * * * *